(12) United States Patent
Ohsawa

(10) Patent No.: US 8,278,649 B2
(45) Date of Patent: Oct. 2, 2012

(54) LIGHT-EMITTING ELEMENT, LIGHT-EMITTING DEVICE AND ELECTRONIC DEVICE

(75) Inventor: Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 582 days.

(21) Appl. No.: 12/404,924

(22) Filed: Mar. 16, 2009

(65) Prior Publication Data

US 2009/0236590 A1  Sep. 24, 2009

(30) Foreign Application Priority Data

Mar. 18, 2008  (JP) ................. 2008-068943

(51) Int. Cl.
*H01L 51/00* (2006.01)

(52) U.S. Cl. ............ 257/40; 257/103; 257/E51.026

(58) Field of Classification Search ............ 257/40, 257/94, 101, 102, 103, E51.026, E33.013; 438/99
See application file for complete search history.

(56) References Cited

U.S. PATENT DOCUMENTS

| | | |
|---|---|---|
| 6,603,150 B2 | 8/2003 | Liao et al. |
| 6,998,487 B2 | 2/2006 | Kim et al. |
| 7,163,831 B2 | 1/2007 | Hasegawa et al. |
| 7,173,370 B2 | 2/2007 | Seo et al. |
| 7,192,659 B2 | 3/2007 | Ricks et al. |
| 7,196,360 B2 | 3/2007 | Seo et al. |
| 7,268,484 B2 | 9/2007 | Nakamura |
| 7,365,360 B2 | 4/2008 | Kang et al. |
| 7,649,211 B2 | 1/2010 | Ohsawa |
| 2002/0086180 A1 | 7/2002 | Seo et al. |
| 2002/0093283 A1 | 7/2002 | Seo et al. |
| 2002/0109136 A1 | 8/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2002/0155632 A1 | 10/2002 | Yamazaki et al. |
| 2003/0010288 A1 | 1/2003 | Yamazaki et al. |
| 2004/0154542 A1 | 8/2004 | Yamazaki et al. |
| 2004/0183082 A1 | 9/2004 | Yamazaki |

(Continued)

FOREIGN PATENT DOCUMENTS

EP  1 718 122 A1  11/2006

(Continued)

OTHER PUBLICATIONS

Danel et al, "Blue-Emitting Anthracenes with End-Capping Diarylamines," Chem. Mater. 2002, pp. 3860-3865.*

(Continued)

*Primary Examiner* — Mattew Landau
*Assistant Examiner* — Colleen E Snow
(74) *Attorney, Agent, or Firm* — Husch Blackwell LLP

(57) ABSTRACT

A light-emitting element with improved emission efficiency is provided. The light-emitting element includes a light-emitting layer in which a first light-emitting layer and a second light-emitting layer are stacked in contact with each other over an anode, and a first substance serving as an emission center substance in the second light-emitting layer constitutes the first light-emitting layer. A second substance serving as a host material to disperse the first substance serving as an emission center substance is included in the second light-emitting layer. In the light-emitting element, the second substance is a substance having an energy gap (or triplet energy) larger than the first substance.

19 Claims, 16 Drawing Sheets

U.S. PATENT DOCUMENTS

| | | |
|---|---|---|
| 2004/0202893 A1 | 10/2004 | Abe |
| 2004/0263066 A1 | 12/2004 | Abe et al. |
| 2005/0095450 A1 | 5/2005 | Begley et al. |
| 2005/0179378 A1 | 8/2005 | Oooka et al. |
| 2005/0221121 A1 | 10/2005 | Ishihara et al. |
| 2005/0260440 A1 | 11/2005 | Seo et al. |
| 2006/0068223 A1 | 3/2006 | Nariyuki et al. |
| 2006/0210828 A1 | 9/2006 | Nakayama et al. |
| 2006/0243967 A1 | 11/2006 | Nomura et al. |
| 2006/0243970 A1 | 11/2006 | Seo et al. |
| 2007/0020483 A1 | 1/2007 | Park et al. |
| 2007/0020484 A1 | 1/2007 | Kim et al. |
| 2007/0075632 A1 | 4/2007 | Kawakami et al. |
| 2007/0159083 A1 | 7/2007 | Matsuura et al. |
| 2007/0216292 A1 | 9/2007 | Seo et al. |
| 2007/0252522 A1 | 11/2007 | Kondakov et al. |
| 2008/0006821 A1 | 1/2008 | Suzuki et al. |
| 2008/0006822 A1 | 1/2008 | Ohsawa |
| 2008/0007164 A1 | 1/2008 | Suzuki et al. |
| 2008/0007165 A1 | 1/2008 | Suzuki et al. |
| 2008/0103315 A1 | 5/2008 | Egawa et al. |
| 2008/0142794 A1 | 6/2008 | Shitagaki et al. |
| 2008/0231177 A1 | 9/2008 | Nomura et al. |
| 2008/0261075 A1 | 10/2008 | Seo et al. |
| 2008/0268284 A1 | 10/2008 | Kawakami et al. |
| 2009/0072725 A1 | 3/2009 | Suzuki et al. |
| 2009/0079326 A1 | 3/2009 | Seo et al. |
| 2009/0079337 A1 | 3/2009 | Seo et al. |
| 2009/0085474 A1 | 4/2009 | Shitagaki et al. |
| 2009/0140634 A1 | 6/2009 | Nomura et al. |
| 2009/0146552 A1* | 6/2009 | Spindler et al. ............. 313/504 |
| 2009/0167168 A1 | 7/2009 | Seo et al. |
| 2009/0200918 A1 | 8/2009 | Seo et al. |
| 2009/0236980 A1 | 9/2009 | Ohsawa |
| 2010/0171112 A1 | 7/2010 | Ohsawa |

FOREIGN PATENT DOCUMENTS

| | | |
|---|---|---|
| JP | 6-158038 | 6/1994 |
| JP | 2001-319779 | 11/2001 |
| JP | 2004-356033 | 12/2004 |
| JP | 2005-11734 | 1/2005 |
| JP | 2005-11735 | 1/2005 |
| JP | 2005-235403 | 9/2005 |
| JP | 2005-285708 | 10/2005 |
| JP | 2006-49057 | 2/2006 |
| JP | 2006-66461 | 3/2006 |
| JP | 2006-173050 | 6/2006 |
| JP | 2007-91721 | 4/2007 |
| JP | 2007-96023 | 4/2007 |
| JP | 2007-227117 | 9/2007 |
| JP | 2007-335214 | 12/2007 |
| WO | WO 2004/096946 A1 | 11/2004 |
| WO | WO 2005/079118 A1 | 8/2005 |
| WO | WO 2007/029530 A1 | 3/2007 |

OTHER PUBLICATIONS

International Search Report re application No. PCT/JP2009/055212, dated May 19, 2009.

Written Opinion re application No. PCT/JP2009/055212, dated May 19, 2009.

D'Andrade, B.W. et al, "White Light Emission Using Triplet Excimers in Electrophosphorescent Organic Light-Emitting Devices," Advanced Materials, vol. 14, No. 15, Aug. 5, 2002, pp. 1032-1036.

Goldsmith, C.R. et al, "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi, T. et al., *High Molecular EL Materials—Development of Light-Emitting High Molecular Compounds* (2) "A Method of Measuring an Energy Level," Kyoritsu Shuppan, Dec. 25, 2004, pp. 64-67 (with English translation, pp. 1-3).

International Search Report re application No. PCT/JP2007/060940, dated Aug. 21, 2007.

Written Opinion re application No. PCT/JP2007/060940, dated Aug. 21, 2007.

International Search Report re application No. PCT/JP2009/055371, dated May 19, 2009.

Written Opinion re application No. PCT/JP2009/055371, dated May 19, 2009.

* cited by examiner

LIGHT-EMITTING ELEMENT, LIGHT-EMITTING DEVICE AND ELECTRONIC DEVICE

TECHNICAL FIELD

The present invention relates to current excitation type light-emitting elements, in particular, an element in which a layer including an organic compound is provided between electrodes. In addition, the present invention relates to light-emitting devices and electronic devices having the light-emitting elements.

BACKGROUND ART

A problem of drain of resources typified by oil has become realistic, and thus government policy and many measures have been taken for environment protection. On the other hand, on an individual level, more and more people are conscious of environment protection, and more and more eco-friendly products are available in markets. New fields which we can call environment protection market or environment protection business have been established.

Nevertheless, consumers tend not to accept low quality of life caused by eco-friendly products, and thus it is necessary for manufacturers to manufacture products that can guarantee high quality of life as well as achieve resource saving, which must lead to increase in business competitiveness. Note that the term "resource saving" has two meanings. One is resource saving in manufacture of products or in consumption cycle of products, which is achieved by eliminating wastes of materials or increasing duration period of products. The other is the reduction of energy consumed in use of products, which is realized by improvement of fuel-efficiency and reduction of power consumption.

Organic EL televisions are widely known as the next generation displays after plasma televisions and liquid crystal televisions. Organic EL televisions use, as pixels, light-emitting elements in which a layer including an organic compound is interposed between electrodes and which emit light by supply of current to the light-emitting elements. Thus, organic EL televisions do not need backlights, which enables the production of extremely flat displays. Further, organic EL televisions have excellent visibility and high response speed. In addition, because organic EL televisions can readily display images with high contrast ratio, they are promising, next generation displays that can exhibit high quality images.

On the other hand, currently commercial organic EL televisions consume electric power about 1.5 times as much as liquid crystal televisions having the same size. It is considered that organic EL televisions can potentially realize lower power consumption than liquid crystal display televisions. However, currently available organic EL televisions still do not possess such a product level.

In recent years resource saving and energy saving are demanded. If organic EL televisions can realize their potential thoroughly and surpass the liquid crystal televisions in power consumption, the organic EL televisions must be an extremely attractive product that is capable of gratifying users' motivation for environment protection and improving quality of life.

There are a wide variety of approaches to reduce power consumption. As for display devices using self-luminous light-emitting elements in pixels, e.g., organic EL televisions, emission efficiency of such light-emitting elements is increased and thereby power consumption can be reduced. Therefore, a large number of studies regarding improvement of emission efficiency of light-emitting elements have been made (Reference 1: Japanese Patent Application Publication No. 2007-227117).

DISCLOSURE OF INVENTION

Although a large number of studies have been made, only few light-emitting elements exhibit sufficient emission efficiency. Thus, further improvement of emission efficiency has been demanded.

It is an object of the present invention to provide light-emitting elements with improved emission efficiency.

In view of the above object, the inventor found that the object is achieved by a light-emitting element with the following structure. Specifically, a light-emitting element includes a light-emitting layer in which a first light-emitting layer and a second light-emitting layer are stacked in contact with each other over an anode, and the first light-emitting layer includes a first substance serving as an emission center substance of the second light-emitting layer. Note that a second substance serving as a host material to disperse the first substance serving as an emission center substance is included in the second light-emitting layer. In the light-emitting element of an embodiment of the present invention, the second substance is a substance having an energy gap (or triplet energy) larger than the first substance.

In other words, an embodiment of the present invention is a light-emitting element including an anode; a cathode; a first light-emitting layer including a first substance; and a second light-emitting layer including the first substance and a second substance, wherein the second substance is a most component in the second light-emitting layer. In the light-emitting element, the first substance is an emission center substance in the second light-emitting layer; the first light-emitting layer and the second light-emitting layer are stacked in contact with each other; the first light-emitting layer is located on the anode side, and the second light-emitting layer is located on the cathode side; and the second substance has an energy gap larger than the first substance.

Further, an embodiment of the present invention is a light-emitting element including an anode; a cathode; and a first light-emitting layer and a second light-emitting layer between the anode and the cathode. In the light-emitting element, the first light-emitting layer and the second light-emitting layer are stacked in contact with each other; the first light-emitting layer is located on the anode side, and the second light-emitting layer is located on the cathode side; the first light-emitting layer includes a first substance; the second light-emitting layer includes the first substance and a second substance; the first substance included in the first light-emitting layer is an emission center substance; the second substance is a most component in the second light-emitting layer; and the second substance has an energy gap larger than the first substance.

Furthermore, an embodiment of the present invention is a light-emitting element including an anode; a cathode; and a first light-emitting layer and a second light-emitting layer between the anode and the cathode. In the light-emitting element, the first light-emitting layer and the second light-emitting layer are stacked in contact with each other; the first light-emitting layer is located on the anode side, and the second light-emitting layer is located on the cathode side; the first light-emitting layer includes a first substance; the second light-emitting layer includes the first substance and a second substance; the content of the first substance in the second light-emitting layer is from 0.001 wt % to 30 wt %, inclusive; and the second substance has an energy gap larger than the first substance.

Another embodiment of the present invention is a light-emitting element in which the first substance is a substance having a hole-transporting property according to any of the above structures.

Another embodiment of the present invention is a light-emitting element in which the first substance is a compound in which anthracene is bound to a diarylamino group via an arylene group, according to any of the above structures.

Moreover, still another embodiment of the present invention is a light-emitting element in which the first substance is a 9,10-diarylanthracene derivative, and the aryl group bound to either the 9 or 10 position of the 9,10-diarylanthracene derivative is further bonded to a diarylamino group, according to any of the above structures.

Moreover, another embodiment of the present invention is a light-emitting element in which the first substance is a substance represented by the following formula (i).

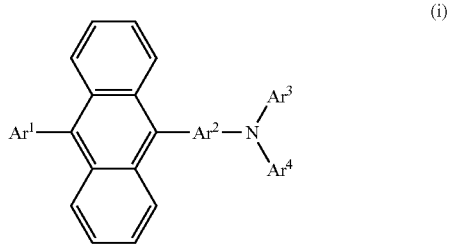

(i)

In the formula, $Ar^1$ represents an aryl group having 6 to 25 carbon atoms, $Ar^2$ represents an arylene group having 6 to 25 carbon atoms, $Ar^3$ and $Ar^4$ independently represent an aryl group having 6 to 25 carbon atoms, or a carbazolyl group. $Ar^3$ and $Ar^4$ independently may have a substituent, and in that case, as the substituent, an alkyl group having 1 to 4 carbon atoms, an aryl group having 6 to 25 carbon atoms, or a carbazolyl group can be given.

The light-emitting element having any of the above structures can improve emission efficiency, in particular, can realize both improvement of emission efficiency and a long lifetime.

According to the present invention, a light-emitting element with improved emission efficiency, in particular, a light-emitting element that realizes both improvement of emission efficiency and a long lifetime can be provided.

BRIEF DESCRIPTION OF DRAWINGS

In the accompanying drawings.

BEST MODE FOR CARRYING OUT THE INVENTION

Embodiment

Embodiments of the present invention will be now described with reference to drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiments. Note that in description of "quantity" "amount" or "content" in this specification, the description is based on mass (weight), if not otherwise specified. Note that the term "anode" in this specification means an electrode that injects holes to a layer containing a light-emitting material, and the term "cathode" means an electrode that injects electrons to the layer containing the light-emitting material.

Embodiment 1

Figure 1A:
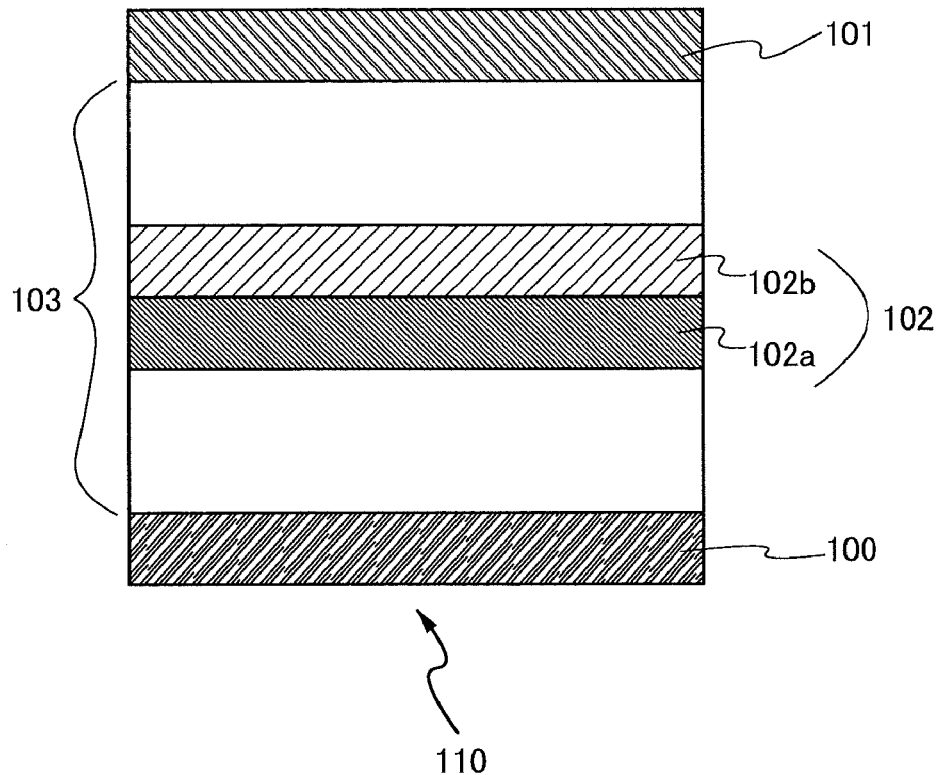
FIGS. 1A and 1B are conceptual diagrams of light-emitting elements according to embodiments of the present invention.

FIG. 1A is a conceptual diagram of a light-emitting element 110 of the present invention. The light-emitting element 110 of the present invention includes a layer 103 containing an organic compound (hereinafter, also referred to as an organic compound-containing layer 103), and the organic compound-containing layer 103 includes plural layers formed between an anode 100 and a cathode 101. The organic compound-containing layer 103 includes at least a light-emitting layer 102, and the light-emitting layer 102 includes a stack of two layers, that is, a first light-emitting layer 102a and a second light-emitting layer 102b stacked over the anode 100. Note that the two layers are in contact with each other. The first light-emitting layer 102a includes a first substance. In addition, the second light-emitting layer 102b includes the first substance and a second substance, in which the second substance is included as a maximum component. Specifically, the first light-emitting layer 102a substantially consists of the first substance, and the first substance is doped in the second light-emitting layer 102b in which the second substance functions as a major component.

In the second light-emitting layer 102b, light is emitted from the first substance when forward voltage is applied to the anode 100 and the cathode 101. Thus, the light-emitting element 110 of the present invention can have a structure in which the first substance serving as an emission center substance in the second light-emitting layer 102b constitutes the first light-emitting layer 102a.

In this case, since the second substance is used as a host to disperse the first substance serving as an emission center substance in the second light-emitting layer 102b, the second substance is preferably a substance whose energy gap is larger than the first substance.

The light-emitting element 110 may include a functional layer that promotes the injection of holes and electrons, transfers and blocks holes or electrons between the light-emitting layer 102 and the anode 100 or between the light-emitting layer 102 and the cathode 101. Typically, a hole-injecting layer formed in contact with the anode 100, a hole-transporting layer formed between the anode 100 and the light-emitting layer 102, an electron-injecting layer formed in contact with the cathode 101, an electron-transporting layer formed between the cathode 101 and the light-emitting layer 102 and the like are given. Note that such a functional layer may have plural functions.

The element structure described above allows the formation of the light-emitting element with an improved emission efficiency, in particular, with both improved emission efficiency and a long lifetime. In a traditional light-emitting element, carriers (holes and electrons) which cannot undergo the recombination in a light-emitting layer readily penetrates the light-emitting layer, which results in low emission efficiency and short lifetime. On the other hand, in the light-emitting element with the above-mentioned structure, electrons which are not recombined in the second light-emitting layer 102b are able to contribute to light emission in the first light-emitting layer 102a, which is considered as one reason for the improved emission efficiency. In addition, as one possible cause of the improvement of the lifetime, electrons which are not recombined in the second light-emitting layer 102b can be recombined in the first light-emitting layer 102a and thus the number of electrons that reach the hole-transporting layer can be reduced, so that degradation of a material included in the hole-transporting layer is suppressed.

Next, the light-emitting element described above will be described more specifically, referring to a manufacturing method thereof. Note that an element structure and a manufacturing method described here are just an example, and other known structures, materials, and manufacturing methods can be applied without departing from the spirit of the present invention.

First, the anode 100 is formed over a support having an insulating surface. For the anode 100, a metal, an alloy, a conductive compound, a mixture thereof, or the like having a high work function (specifically, of 4.0 eV or higher) is preferably used. Specifically, for example, indium tin oxide (ITO), indium tin oxide including silicon or silicon oxide, indium oxide including zinc oxide (ZnO), indium oxide including tungsten oxide and zinc oxide (IWZO), or the like is given. Although these conductive metal oxide films are generally formed by sputtering, they may be formed by applying a sol-gel method or the like. For example, indium oxide including zinc oxide (ZnO) can be formed by a sputtering method using a target in which 1 to 20 wt % zinc oxide is added to indium oxide. In addition, indium oxide including tungsten oxide and zinc oxide (IWZO) can be formed by a sputtering method using indium oxide into which tungsten oxide of 0.5 to 5 wt % and zinc oxide of 0.1 to 1 wt % are added, as a target. Moreover, gold (Au), platinum (Pt), nickel (Ni), tungsten (W), chromium (Cr), molybdenum (Mo), iron (Fe), cobalt (Co), copper (Cu), palladium (Pd), a nitride of a metal (e.g., titanium nitride), or the like can be used.

Figure 1B:
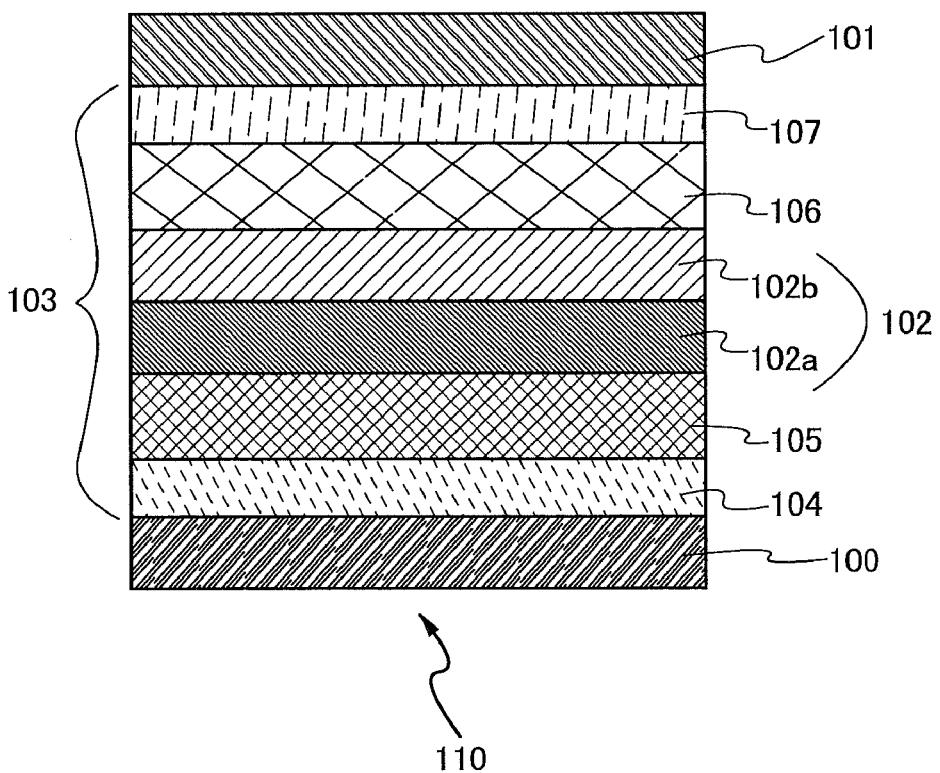

Subsequently, the organic compound-containing layer 103 is formed. The organic compound-containing layer 103 can be formed using either a low molecular material or a high molecular material. In addition, the material forming the organic compound-containing layer 103 is not limited to a material containing only an organic compound material, and may partially contain an inorganic compound. The organic compound-containing layer 103 is generally formed by an appropriate combination of functional layers, such as a hole-injecting layer, a hole-transporting layer, a hole-blocking layer, a light-emitting layer, an electron-transporting layer, and an electron-injecting layer. The organic compound-containing layer 103 may include a layer having two or more functions of the above layers, or none of the above layers may be formed. A layer having a function other than the above layers may be provided. As the organic compound-containing layer 103 in this embodiment, as illustrated in FIG. 1B, a light-emitting element having a stack structure in which a hole-injecting layer 104, a hole-transporting layer 105, the light-emitting layer 102 (the first light-emitting layer 102a and the second light-emitting layer 102b), an electron-transporting layer 106, and an electron-injecting layer 107 are stacked sequentially over the anode 100 is described as an example.

As an example for the material of the hole-injecting layer 104, metal oxides such as vanadium oxide, molybdenum oxide, ruthenium oxide, and aluminum oxide are given. Alternatively, if an organic compound is used, a porphyrin-based compound is effective, and phthalocyanine (abbreviation: $H_2Pc$), copper phthalocyanine (abbreviation: CuPc), or the like can be used. As the hole-injecting layer 104, a high-molecular compound (such as oligomer, dendrimer, or polymer) can be used. For example, the following high molecular compounds can be used: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Further, high molecular compounds mixed with an acid, such as poly(3,4-ethylenedioxythiophene)/poly(styrenesulfonate) (PEDOT/PSS) and polyaniline/poly(styrenesulfonate) (PAni/PSS) can also be used. The hole-injecting layer is formed to be in contact with the anode. By providing the hole-injecting layer 104, a carrier injection barrier can be lowered and carriers are efficiently injected into the light-emitting element; as a result, a drive voltage can be reduced.

Alternatively, as the hole-injecting layer 104, a material obtained by adding an acceptor material to a material with a high hole-transporting property (hereinafter, a composite material) can be used. Note that, by using the material with a high hole-transporting property containing an acceptor substance, the material can undergo an ohmic contact with an electrode and a material used to form an electrode may be selected regardless of its work function. In other words, besides a material with a high work function, a material with a low work function may also be used as the anode. As the acceptor substance, 7,7,8,8-tetracyano-2,3,5,6-tetrafluoro-quinodimethane (abbreviation: $F_4$-TCNQ), chloranil, and the like can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron accepting property. Above all, molybdenum oxide is particularly preferable because it is stable even in atmospheric air, has a low hygroscopic property, and is easy to handle.

It is to be noted that, in this specification, the term "composition" refers to not only a state where a plurality of materials are simply mixed but also a state where charges are transferred between plural materials by mixing the materials.

As the substance having a high hole-transporting property used for the composite material, any of various compounds such as an aromatic amine compound, a carbazole derivative, an aromatic hydrocarbon, and a polymeric compound (such as an oligomer, a dendrimer, or a polymer) can be used. A substance having a hole mobility of $10^{-6}$ cm$^2$/Vs or higher is preferably used as the substance having a high hole-transporting property used for the composite material. However, any other substances can be used as long as they have a hole-transporting property higher than an electron-transporting property. Hereinafter, organic compounds which can be used for the composite material will be specifically listed.

Examples of such an aromatic amine compound which can be used for the composite material include 4,4'-bis[N-(1-naphthyl)-N-phenylamino]biphenyl (NPB or α-NPD), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like.

Examples of such a carbazole derivative which can be used for the composite material include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Further, pentacene, coronene, or the like can be used. Thus, an aromatic hydrocarbon having a hole mobility of equal to or greater than $1\times10^{-6}$ cm$^2$/Vs and having 14 to 42 carbon atoms is preferable.

Note that the aromatic hydrocarbon which can be used for the composite material may have a vinyl skeleton. Examples of the aromatic hydrocarbon having a vinyl skeleton are 4,4'-bis(2,2-diphenylvinyl)biphenyl (abbreviation: DPVBi) 9,10-bis[4-(2,2-diphenylvinyl)phenyl]anthracene (abbreviation: DPVPA), and the like.

Note that the hole-injecting layer can be formed using a composite material of the above-described high molecular compound, such as PVK, PVTPA, PTPDMA, or Poly-TPD, and the above-described acceptor substance.

As described above, when a composite material is used for the hole-injecting layer 104, various metals, alloys, electrically conductive compounds or mixture thereof can be used for the anode 100, regardless of the work function. For example, aluminum (Al), silver (Ag), an aluminum alloy (e.g., AlSi), or the like can be used as the anode, in addition to the above-described materials. Alternatively, any of the following low-work function materials can be used: Group 1 and Group 2 elements of the periodic table, that is, alkali metals such as lithium (Li) and cesium (Cs) and alkaline-earth metals such as magnesium (Mg), calcium (Ca), and strontium (Sr), and alloys thereof (MgAg, AlLi); rare earth metals such as europium (Eu) and ytterbium (Yb), and alloys thereof; and the like. A film made of an alkali metal, an alkaline earth metal, or an alloy of them can be formed by a vacuum deposition method. Further, a film made of an alloy of an alkali metal or an alkaline earth metal can be formed by a sputtering method. It is also possible to deposit a silver paste or the like by an inkjet method or the like.

The hole-transporting layer 105 can be formed using a material such as N,N'-bis(spiro-9,9'-bifluoren-2-yl)-N,N'-diphenylbenzidine (abbreviation: BSPB) 4,4'-bis[N-(1-naphthyl)-N-phenylamino]biphenyl (abbreviation: NPB or α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis(N-{4-[N'-(3-methylphenyl)-N'-phenylamino]phenyl}-N-phenylamino)biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: H$_2$Pc), copper phthalocyanine (abbreviation: CuPc), or vanadyl phthalocyanine (abbreviation: VOPc). Note that the hole-transporting layer is preferably formed using a substance having a hole mobility of $1\times10^{-6}$ cm$^2$/Vs or higher, but any material can be used as long as the material has a hole-transporting property higher than an electron-transporting property. The hole-transporting layer may be formed with not only a single layer but also a multilayer of two or more layers made of substances which satisfy the above conditions. The hole-transporting layer can be formed by a vacuum deposition method or the like.

As the hole-transporting layer 105, the compound with a high molecular-weight such as PVK, PVTPA, PTPDMA, or Poly-TPD which are described above as materials of the hole-injecting layer 104 can be used. In this case, a solution process such as an inkjet method or a spin coating method can be used.

The light-emitting layer 102 is formed with a stack in which two layers, that is, the first light-emitting layer 102a and the second light-emitting layer 102b are stacked over the hole-transporting layer 105.

The first light-emitting layer 102a includes the first substance serving as an emission center substance in the second light-emitting layer.

The second light-emitting layer 102b includes the first substance and the second substance, wherein the second substance is a maximum component and the first substance is included at 0.001 wt % or higher and lower than 50 wt %. The second light-emitting layer 102b is a host-guest type light-emitting layer in which the first substance serving as an emission center substance is dispersed in the second substance. Thus, the second substance is preferably a substance having an energy gap larger than the first substance. When the first substance emits phosphorescence, the second substance is preferably a substance having triplet energy (an energy difference between a ground state and a triplet excited state) higher than the first substance. This is for the prevention of transfer of the excited energy from the first substance to the second substance and decrease in emission efficiency or color purity. The light-emitting layer can be formed by a vacuum deposition method, and it can be formed by a co-deposition method in which different materials are evaporated at the same time. Further, a wet process such as a spin coating method or a droplet discharging method may be employed instead of a deposition method. In addition, since the second light-emitting layer 102b is a host-guest type light-emitting layer, the first substance is preferably included in the second light-emitting layer 102b at 0.001 wt % or higher and lower than 30 wt % for excellent emission efficiency.

In the light-emitting element 110 including the light-emitting layer 102 having the above structure, electrons that are not recombined to contribute to light emission in the second light-emitting layer 102b are trapped by the first substance which constitutes the first light-emitting layer 102a, and are recombined with holes to contribute to light emission, so that emission efficiency is increased. Thus, the number of electrons that reach the hole-transporting layer 105 is reduced, so that degradation due to such electrons of a material included in the hole-transporting layer and an adverse effect on the lifetime of the light-emitting element are suppressed.

Figure 2:
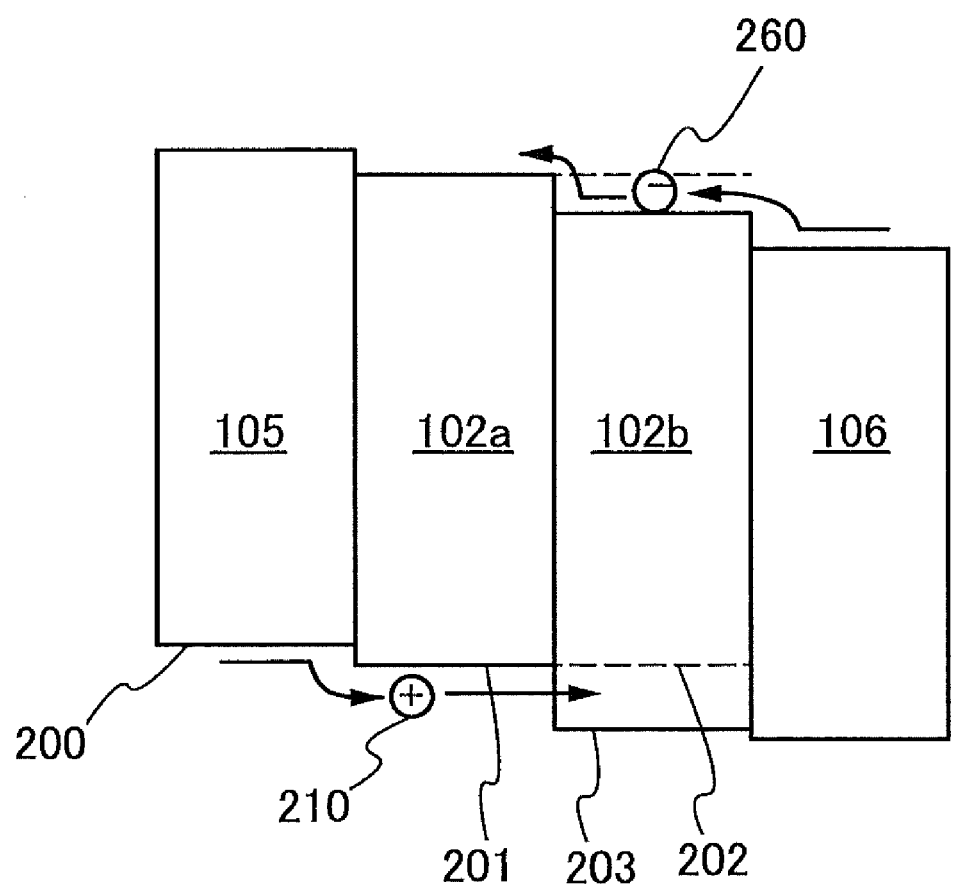
FIG. 2 illustrates an example of an energy level diagram in a light-emitting element according to an embodiment of the present invention.

Although the thickness of the light-emitting layer is increased as compared with general light-emitting elements, it is characteristic that the driving voltage of the light-emitting element described in this embodiment is negligibly increased compared with a light-emitting element without the first light-emitting layer, which is in contrast to general feature that increase in thickness of the light-emitting layer readily leads to increase in driving voltage. FIG. 2 illustrates an energy level diagram of the light-emitting element 110 described in this embodiment. FIG. 2 illustrates energy level models of the hole-transporting layer 105; the first light-emitting layer 102a; the second light-emitting layer 102b; and the electron-transporting layer 106. In addition, reference numerals 210 and 260 denote holes and electrons, respectively. The holes 210 that are transported through the hole-transporting layer 105 are injected to a HOMO level 201 of the first light-emitting layer 102a from a HOMO level 200 of the hole-transporting layer 105. Then, some of the holes 210 that have been transferred to the HOMO level 201 of the first light-emitting layer 102a are recombined, in the vicinity of the second light-emitting layer 102b, with electrons 260 that are injected from the electron-transporting layer 106 and do not contribute to light emission in the second light-emitting layer 102b. The other holes are injected to the second light-emitting layer 102b. A general light-emitting element does not include the first light-emitting layer 102a, and thus the holes 210 are directly injected to a HOMO level 203 of the host substance (second substance) in the second light-emitting layer 102b from the hole-transporting layer 105, so that an injection barrier is high. In this case, in the light-emitting element 110 in this embodiment, the first light-emitting layer 102a includes a first substance serving as an emission center substance of the second light-emitting layer 102b. In other words, the HOMO level 201 of the first light-emitting layer 102a and the HOMO level 202 of the first substance (as an emission center substance) in the second light-emitting layer 102b are continuous. It is thus thought that hole injection from the first light-emitting layer 102a to the emission center substance of the second light-emitting layer 102b is facilitated, so that increase of driving voltage can be suppressed. Namely, it is considered that provision of the first light-emitting layer 102a including the first substance facilitates injection of the holes 210 to the second substance included in the second light-emitting layer 102b.

Next, a material which can be used for the light-emitting layer 102 is described. The first substance can be an emission center substance in the second light-emitting layer 102b, and can emit fluorescence or phosphorescence. The first substance preferably has a hole-transporting property so that recombination can be efficiently conducted in the second light-emitting layer 102b. As examples of such a substance, 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), 9,10-bis{4-[N-(4-diphenylaminophenyl)-N-phenylamino]phenyl}-2-tert-buthylanthracene (abbreviation: DPABPA), 4-(9H-carbazol-9-yl)-4'-(10-phenyl-9-anthryl)triphenylamine (abbreviation: YGAPA), 9,10-bis(4-{N-[4-(9-carbazolyl)phenyl]-N-phenylamino}phenyl)-2-tert-buthylanthracene (abbreviation: YGABPA), 2-tert-buthyl-9,10-bis{4-[N-(9-phenylcarbazol-3-yl)-N-phenylamino]phenyl}anthracene (abbreviation: PCABPA), N,9-diphenyl-N-[4-(10-phenyl-9-anthryl)phenyl]-9H-carbazol-3-amine (abbreviation: PCAPA), 2-{4-[N-phenyl-N-(9-phenylcarbazol-3-yl)amino]phenyl}-9,10-diphenylanthracene (abbreviation: 2PCAPPA), 2-(4-{N-[4-(carbazol-9-yl)phenyl]-N-phenylamino}phenyl)-9,10-diphenylanthracene (abbreviation: 2YGAPPA), 2-{4-[N-(4-diphenylaminophenyl)-N-phenylamino]phenyl}-9,10-diphenylanthracene (abbreviation: 2DPAPPA), 4-(10-phenyl-9-anthryl)triphenylamine (abbreviation: DPhPA), 4-(10-phenyl-9-anthryl)-4'-phenyl-triphenylamine (abbreviation: BPAPA) and the like can be given. In particular, compounds formed of anthracene and a diarylamino group connected via an arylene group are preferable materials. Among them, a substance represented by the following formula (i) is preferably used in which an aryl group (i.e., $Ar^2$ in formula (i)) at either the 9 or 10 position of 9,10-diarylanthracene is further bound to the diarylamino group. Note that the material included in the hole-transporting layer 105 may be different from the material of the first light-emitting layer 102a.

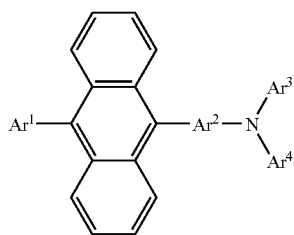

(i)

In the formula, $Ar^1$ represents an aryl group having 6 to 25 carbon atoms, $Ar^2$ represents an arylene group having 6 to 25 carbon atoms, and $Ar^3$ and $Ar^4$ independently represent an aryl group having 6 to 25 carbon atoms or a carbazolyl group. $Ar^3$ and $Ar^4$ independently may have a substituent, and in that case, as the substituent, an alkyl group having 1 to 4 carbon atoms, an aryl group having 6 to 25 carbon atoms, or a carbazolyl group can be given. As the aryl group having 6 to 25 carbon atoms, for example, a phenyl group, an o-biphenyl group, a m-biphenyl group, a p-biphenyl group, a fluoren-2-yl group, a spiro-9,9'-bifluorene-2-yl group, a naphthyl group and the like can be given. In addition, as an arylene group having 6 to 25 carbon atoms, a divalent unit or the like derived from benzene, naphthalene, biphenyl, fluorene or spirofluorene can be given. Namely, the arylene group having 6 to 25 carbon atoms can be a phenylene group, a biphenylene group, a fluorenylene group, or a spirofluorenylene group. In addition, as an alkyl group having 1 to 4 carbon atoms, for example, a methyl group, an ethyl group, a propyl group, an isopropyl group, a butyl group, an isobutyl group, a tert-butyl group and the like can be given.

As examples of substances that can be preferably used for the first substance as described above, 4-(10-phenyl-9-anthryl)-4'-(9-phenyl-9H-carbazol-3-yl)triphenylamine (abbreviation: PCBAPA) represented by the structural formula (1), 4-[4-(10-phenyl-9-anthryl)phenyl]-4'-(9-phenyl-9H-carbazol-3-yl)triphenylamine (abbreviation: PCBAPBA) represented by the structural formula (2), N,9-diphenyl-N-[4-(10-phenyl-9-anthryl)phenyl]-9H-carbazol-3-amine (abbreviation: PCAPA) represented by the structural formula (3) and the like are given.

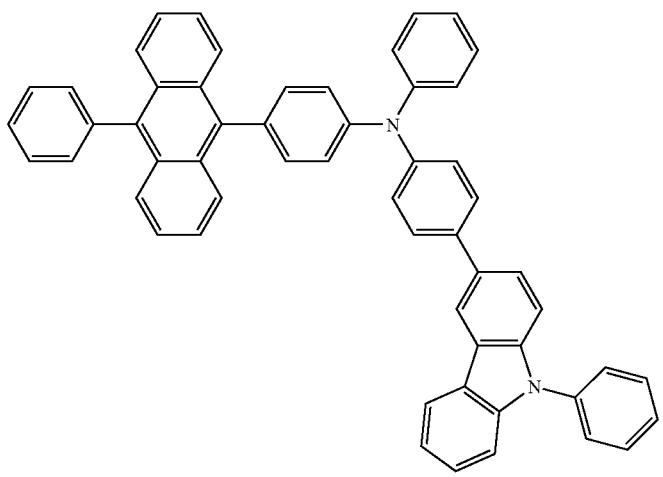

PCBAPA (1)

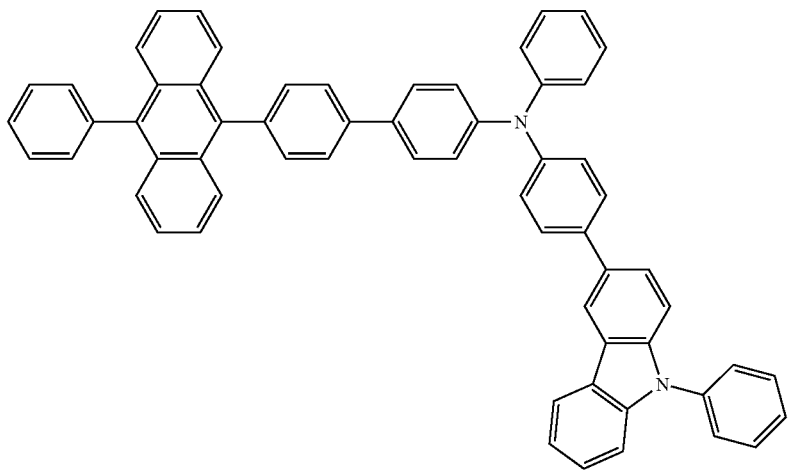

PCBAPBA (2)

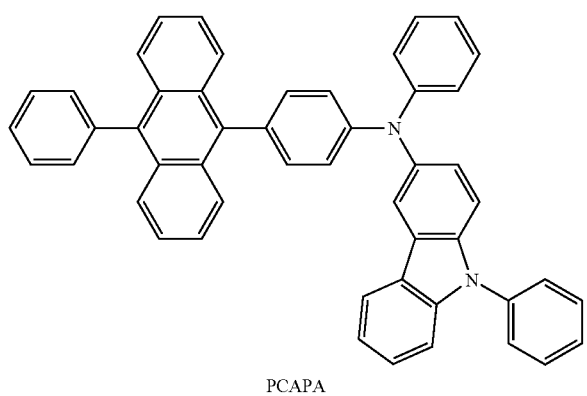

PCAPA

The second substance serves a host material to disperse the first substance in the second light-emitting layer 102b. Example of such a material include metal complexes such as tris(8-quinolinolato)aluminum(III) (abbreviation: Alq), tris (4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), bis(8-quinolinolato) zinc(II) (Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3, 4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP), and 9-[4-(5-phenyl-1,3, 4-oxadiazol-2-yl)phenyl]carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given: 9,10-diphenylanthracene (abbreviation: DPAnth); N,N-diphenyl-9-[4-(10-phenyl-9-anthryl)phenyl]-9H-carbazol-3-amine (abbreviation: CzA1PA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}-9H-carbazol-3-amine (abbreviation: PCAPBA); N-9-diphenyl-N-(9,10-diphenyl-2-anthryl)-9H-carbazol-3-amine (abbreviation: 2PCAPA); 6,12-dimethoxy-5,11-diphenylchrysene, N,N,N',N',N'',N'',N''',N'''-octaphenyldibenzo[g,p]chrysene-2,7,10,15-tetramine (abbreviation: DBC1); 9-[4-(10-phenyl-9-anthryl)phenyl]-9H-carbazole (abbreviation: CzPA); 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3) and the like. A substance having an energy gap which is larger than that of the first substance may be selected from these substances and known substances. Moreover, in the case where the first substance emits phosphorescence, the second substance may be a substance having triplet energy (energy difference between a ground state and a triplet excitation state) higher than the emission center substance.

In the case of using the electron-transporting layer 106, it is provided between the light-emitting layer 102 and the electron-injecting layer 107. As suitable materials, metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq) can be used. Besides the above-described metal complexes, metal complexes having an oxazole ligand or a thiazole ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$), and the like can also be used. Furthermore, beside the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), bathophenanthroline (abbreviation: BPhen), bathocuproine (abbreviation: BCP), and the like can also be used. Although a substance having an electron mobility of $10^{-6}$ cm$^2$/Vs or higher is preferably used for the electron-transporting layer, any substance can be used for the electron-transporting layer as long as it has an electron-transporting property higher than a hole-transporting property. Moreover, the electron-transporting layer is not limited to a single-layer structure, and may be formed as a multilayer structure in which two or more layers formed of substances which satisfy the above-described conditions are mixed. The electron-transporting layer can be formed by a vacuum deposition method or the like.

Alternatively, a high molecular compound can be used for the electron-transporting layer. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used. In this case, a solution process such as an inkjet method or a spin coating method can be used.

Note that for the electron-transporting layer 106 which is in contact with the second light-emitting layer 102b, a substance having an energy gap (or triplet energy) larger than that of the first substance which is an emission center substance of second light-emitting layer 102b is preferably used. Such a structure makes it possible to suppress energy transfer from the light-emitting layer 102 to the electron-transporting layer 106 and realize high emission efficiency.

In the case of using an electron-injecting layer 107, there are no particular limitations on a material used for forming the electron-injecting layer 107. Specifically, an alkali metal compound or an alkaline earth metal compound such as calcium fluoride, lithium fluoride, lithium oxide, or lithium chloride, or the like is preferable. Alternatively, a layer in which an electron-transporting material such as tris(8-quinolinolato) aluminum (Alq) or bathocuproine (BCP) is combined with alkali metal or alkaline earth metal such as lithium or magnesium can also be used. The electron-injecting layer is formed in contact with a cathode, and a carrier injection barrier is reduced by use of the electron-injecting layer, so that carriers are efficiently injected into the light-emitting element, which results in reduction of driving voltage. It is more preferable that the electron-injecting layer is formed using such a layer in which a substance having an electron-transporting property is combined with alkali metal or alkaline earth metal, because electron injection from the cathode efficiently proceeds. Moreover, by provision of the electron-injecting layer 107, any of a variety of conductive materials such as Al, Ag, ITO, and indium tin oxide containing silicon or silicon oxide can be used as the cathode regardless of its work function.

Note that the organic compound-containing layer 103 can be formed by either a wet process or a dry process, such as a deposition method, an inkjet method, a spin coating method, or a dip coating method, as well as the above-described formation method.

After that, the cathode 101 is formed, so that the light-emitting element 110 is completed. The cathode 101 can be formed using metal, an alloy, a conductive material, and a mixture thereof each having a low work function (specifically, 3.8 eV or lower). Specifically, metal belonging to Group 1 or 2 of the periodic table, that is, alkali metal such as lithium (Li) or cesium (Cs); alkaline earth metal such as magnesium (Mg), calcium (Ca), or strontium (Sr); or an alloy containing such metal (e.g., MgAg or AlLi); rare earth metal such as europium (Er) or ytterbium (Yb), an alloy containing these metals, or the like can be given. A film made of alkali metal, alkaline earth metal, or an alloy of them can be formed by a vacuum deposition method. Further, a film made of an alloy of alkali metal or alkaline earth metal can be formed by a sputtering method. Further, silver paste or the like can be applied by inkjet to form the cathode. Moreover, by provision of the electron-injecting layer 107 between the cathode 101 and the electron-transporting layer 106, any of a variety of conductive materials such as Al, Ag, ITO, and indium tin oxide containing silicon or silicon oxide can be used regardless of its work function.

Note that a conductive composition containing a conductive high molecule (also referred to as a "conductive polymer") can be used for the anode 100 and the cathode 101. When a thin film of a conductive composition is formed as the anode 100 or the cathode 101, the thin film preferably has sheet resistance of 10000 Ω/square or lower and light transmittance of 70% or higher at a wavelength of 550 nm. Note that the resistance of the used conductive high molecule is preferably 0.1 Ω·cm or lower.

As such a conductive high molecule, a so-called π electron conjugated high molecule can be used. For example, polyaniline and/or a derivative thereof, polypyrrole and/or a derivative thereof, polythiophene and/or a derivative thereof, and a copolymer of two or more kinds of those materials can be given.

Specific examples of such a conjugated conductive high molecule include polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

One of the above-described conductive high molecular compounds can be used alone for the anode 100 or the cathode 101, or an organic resin is added to such a conductive high molecular compound in order to adjust film characteristics, so that it can be used as a conductive composition.

As for an organic resin, a thermosetting resin, a thermoplastic resin, or a photocurable resin may be used as long as such a resin is compatible to a conductive high molecule or such a resin can be mixed with and dispersed into a conductive high molecule. For example, a polyester-based resin such as poly(ethylene terephthalate), poly(butylene terephthalate), or poly(ethylene naphthalate); a polyimide-based resin such as polyimide or polyimideamide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene tetrafluoroethylene copolymer, or polychlorotrifluoroethylene; a vinyl resin such as poly(vinyl alcohol), poly(vinyl ether), poly(vinyl butyral), poly(vinyl acetate), or poly(vinyl chloride); an epoxy resin; a xylene resin; an aramid resin; a polyurethane-based resin; a polyurea-based resin, a melamine resin; a phenol-based resin; polyether; an acrylic-based resin, or a copolymer of any of those resins can be given.

Furthermore, in order to adjust the electrical conductivity of the conductive high molecule or the conductive composition, the conductive high molecule or the conductive composition may be doped with an acceptor dopant or a donor dopant to change the oxidation-reduction potential of the conjugated conductive high molecule.

As the acceptor dopant, a halogen compound, an organic cyano compound, an organometallic compound, or the like can be used. Examples of the halogen compound include chlorine, bromine, iodine, iodine chloride, iodine bromide, iodine fluoride, and the like. As the organic cyano compound, a conjugated compound in which two or more cyano groups are included can be used. For example, tetracyanoethylene, tetracyanoethylene oxide, tetracyanobenzene, tetracyanoquinodimethane, tetracyanoazanaphthalene, and the like are given. Phosphorus pentafluoride, arsenic pentafluoride, antimony pentafluoride, boron trifluoride, boron trichloride, and boron tribromide; inorganic acids such as hydrochloric acid, sulfuric acid, nitric acid, phosphoric acid, fluoroboric acid, hydrofluoric acid, and perchloric acid; and organic acids such as organic carboxylic acid and organic sulfonic acid can be used.

As the donor dopant, alkali metal, alkaline earth metal, a tertiary amine compound and the like can be given.

A thin film used for the anode 100 or the cathode 101 can be formed by a wet process using a solution in which the conductive high molecule or the conductive composition is dissolved in water or an organic solvent (e.g., an alcohol solvent, a ketone solvent, an ester solvent, a hydrocarbon solvent, or an aromatic solvent).

The solvent for dissolving the conductive high molecule or the conductive composition is not particularly limited. A solvent which dissolves the above-described conductive high molecule and polymer resin compound may be used. For example, the conductive composition may be dissolved in a single solvent or a mixed solvent of the following: water, methanol, ethanol, propylene carbonate, N-methylpyrrolidone, N,N-dimethylformamide, N,N-dimethylacetamide, cyclohexanone, acetone, methyl ethyl ketone, methyl isobutyl ketone, toluene, and/or the like.

A film of the conductive composition can be formed by a wet process such as an application method, a coating method, a droplet discharge method (also referred to as "an inkjet method"), or a printing method after the conductive composition is dissolved in a solvent. The solvent may be evaporated with heat treatment or may be evaporated under reduced pressure. In the case where the organic resin is a thermosetting resin, heat treatment may be further performed. In the case where the organic resin is a photocurable resin, light irradiation treatment may be performed.

Note that by change of materials of the anode 100 and the cathode 101, the light-emitting element of this embodiment can have variations. When the anode 100 has a light-transmitting property, light is emitted from the anode 100 side, whereas when the anode 100 has a light-shielding property (reflectivity, in particular) and the cathode 101 has a light-transmitting property, light is emitted from the cathode 101 side. Furthermore, when both the anode 100 and the cathode 101 have a light-transmitting property, light can be emitted from both the anode side and the cathode side.

The element structure in this embodiment described above can provide a light-emitting element with improved emission efficiency, in particular, with both improved emission efficiency and a long lifetime.

Embodiment 2

In this embodiment, an example of a light-emitting device manufactured using the light-emitting element described in Embodiment 1 will be described. Note that the light-emitting device of the present invention is not limited to a light-emitting device having a structure described below, and includes, in its category, all devices in which the light-emitting element described in Embodiment 1 is used for their display portions (e.g., a pixel portion 602 in this embodiment).

Figure 3A:
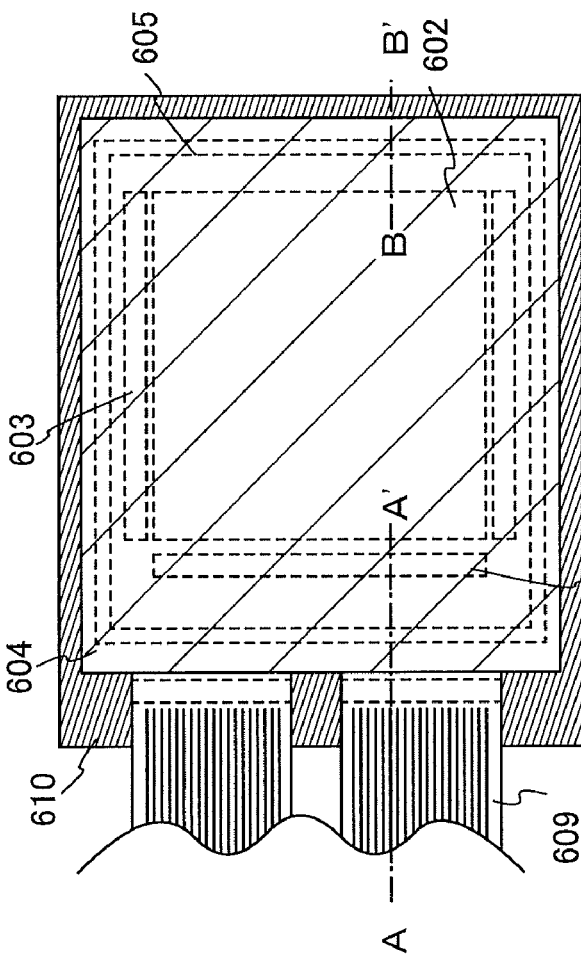
FIGS. 3A and 3B are a top view and a cross-sectional view, respectively, of a light-emitting device according to an embodiment of the present invention.
Figure 3B:
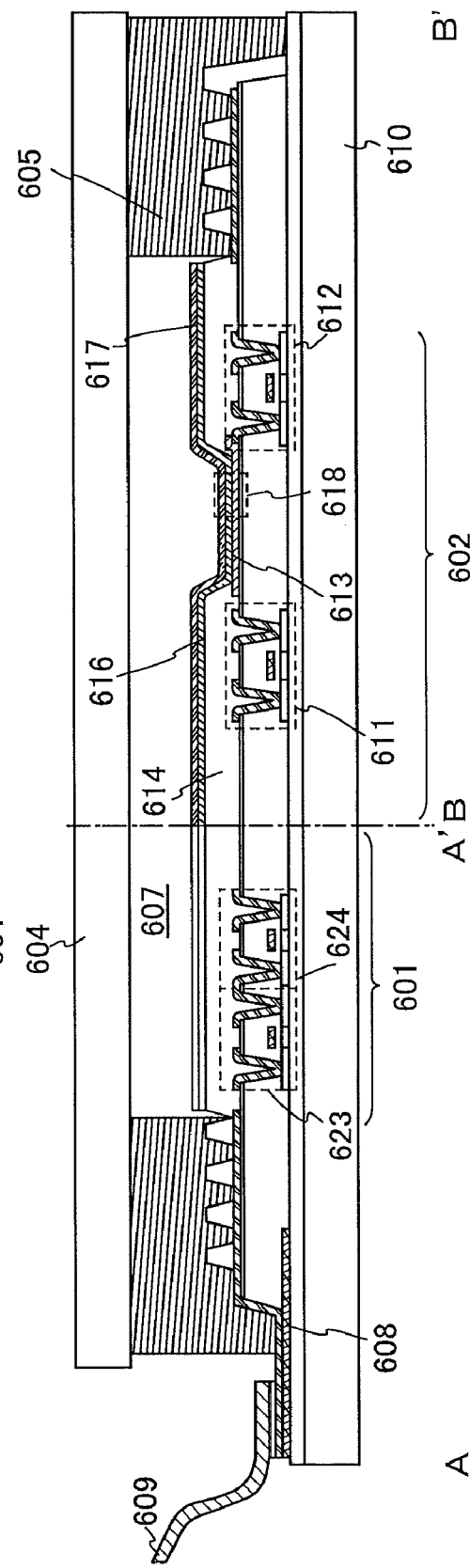

An example of a light-emitting device manufactured using the light-emitting element described in Embodiment 1 will be described with reference to FIGS. 3A and 3B. FIG. 3A is a top view of the light-emitting device, and FIG. 3B is a cross-sectional view taken along A-A' and B-B' in FIG. 3A. This light-emitting device includes a driver circuit portion (a source side driver circuit) 601, a pixel portion 602, and a driver circuit portion (a gate side driver circuit) 603, which are shown by dotted lines, in order to control light emission of the light-emitting element. Also, a reference numeral 604 represents a sealing substrate, a reference numeral 605 represents a sealant, and the inside surrounded by the sealant 605 is a space 607.

A lead wiring 608 is a wiring for transmitting a signal to be inputted to the source side driver circuit 601 and the gate side driver circuit 603, and this lead wiring 608 receives a video signal, a clock signal, a start signal, a reset signal, and the like from a flexible printed circuit (FPC) 609 that is an external input terminal. Although only the FPC is illustrated here, the FPC may be provided with a printed wiring board (PWB). The light-emitting device in this specification includes not only the light-emitting device itself but also a light-emitting device to which an FPC or a PWB is attached.

Next, a cross-sectional structure will be explained with reference to FIG. 3B. The driver circuit portion and the pixel portion are formed over an element substrate 610. Here, the source side driver circuit 601 which is the driver circuit portion and one pixel in the pixel portion 602 are shown.

A CMOS circuit in which an n-channel TFT 623 and a p-channel TFT 624 are combined is formed for the source side driver circuit 601. The driver circuit may be formed with any of various circuits such as CMOS circuits, PMOS circuits and NMOS circuits. Although a driver integration type in which a driver circuit is formed over the same substrate is described in this embodiment, it is not necessarily formed over the same substrate and a driver circuit can be formed not over a substrate but outside a substrate.

The pixel portion 602 has a plurality of pixels, each of which includes a switching TFT 611, a current control TFT 612, a first electrode 613 which is electrically connected to a drain of the current control TFT 612, and a light-emitting element including the first electrode 613, a layer 616 containing an organic compound, and a second electrode 617. Note that an insulator 614 is formed so as to cover an end portion of the first electrode 613. In this embodiment, the insulator 614 is formed using a positive photosensitive acrylic resin film.

In order to obtain favorable coverage, the insulator 614 is formed to have a curved surface with curvature at an upper end portion or a lower end portion thereof. For example, in the case of using a positive photosensitive acrylic resin as a material for the insulator 614, the insulator 614 is preferably formed so as to have a curved surface with a curvature radius (0.2 μm to 3 μm) only at the upper end portion thereof. Either a negative type which becomes insoluble in an etchant by light irradiation or a positive type which becomes soluble in an etchant by light irradiation can be used as the insulator 614.

The layer 616 containing the organic compound and the second electrode 617 are stacked over the first electrode 613, so that a light-emitting element 618 is formed. As a material used for the first electrode 613 which serves as an anode, metal, an alloy, a conductive compound, and a mixture thereof each having a high work function (specifically, 4.0 eV or higher) is preferably used. Specifically, a single layer or a stacked-layer structure of indium tin oxide (ITO), indium tin oxide containing silicon or silicon oxide, indium oxide containing zinc oxide (ZnO), indium oxide containing tungsten oxide and zinc oxide (IWZO), gold (Au), platinum (Pt), nickel (Ni), tungsten (W), chromium (Cr), molybdenum (Mo), iron (Fe), cobalt (Co), copper (Cu), palladium (Pd), or nitride of a metal (e.g., titanium nitride), can be used. Moreover, a stacked-layer structure including a film containing titanium nitride and a film containing aluminum as its main component; a three-layer structure including a titanium nitride film, a film containing aluminum as its main component, and a titanium nitride film; or the like can be used. When the stacked-layer structure is used, low wiring resistance, favorable ohmic contact, and a function as an anode are achieved. Further, by using a composite layer as described in Embodiment 1 as the hole-injecting layer, a material used for the first electrode can be selected regardless of its work function.

The layer 616 containing the organic compound has a similar structure to the organic compound-containing layer 103 described in Embodiment 1. Either low molecular compounds or high molecular compounds (including oligomers and dendrimers) may be employed as the material used for the layer 616 containing the organic compound. Moreover, not only organic compounds but also inorganic compounds can be partially used for the material for forming the layer 616 containing the organic compound. In addition, the layer 616 containing the organic compound can be formed by any of different kinds of methods such as a deposition method using an evaporation mask, an inkjet method, and a spin coating method.

As a material used for the second electrode 617, which is formed over the layer 616 containing the organic compound and serves as a cathode, a material having a low work function (Al, Mg, Li, Ca, or an alloy or a compound thereof, such as MgAg, MgIn, AlLi, LiF, or $CaF_2$) is preferably used. In the case where light generated in the layer 616 containing the organic compound is transmitted through the second electrode 617, stacked layers of a metal thin film with reduced thickness and a transparent conductive film (ITO, indium oxide containing 2 wt % to 20 wt % of zinc oxide, indium tin oxide containing silicon or silicon oxide, zinc oxide (ZnO), or the like) are preferably used as the second electrode 617. Further, by using an electron-injecting layer as described in Embodiment 1, a material used for the second electrode can be selected regardless of its work function.

As described above, the light-emitting element includes the first electrode 613, the layer 616 containing the organic compound, and the second electrode 617. The specific structures and materials of the light-emitting element have been described in Embodiment 1, and the repeated description is omitted. The description in Embodiment 1 is to be referred to. Note that the first electrode 613, the layer 616 containing the organic compound, and the second electrode 617 in this embodiment correspond to the anode 100, the organic compound-containing layer 103, and the cathode 101 in Embodiment 1, respectively.

The element substrate 610 in which TFTs for the driver circuit and the pixel portion and the light-emitting element are formed is attached to the sealing substrate 604 with the sealant 605, so that a light-emitting device can be provided, in which the light-emitting element 618 described in Embodiment 2 is provided in the space 607 surrounded by the element substrate 610, the sealing substrate 604, and the sealant 605. Note that the space 607 may be filled with a filler. There is a case where the space 607 is filled with an inert gas (such as nitrogen or argon), or where the space 607 is filled with the sealant 605.

Note that an epoxy-based resin is preferably used as the sealant 605. Preferably, the material allows as little moisture and oxygen as possible to penetrate therethrough. As the sealing substrate 604, a plastic substrate formed of FRP (fiberglass-reinforced plastics), PVF (poly(vinyl fluoride)), polyester, acrylic, or the like can be used besides a glass substrate or a quartz substrate.

As described above, a light-emitting device manufactured using the light-emitting element described in Embodiment 1 can be obtained The light-emitting device in this embodiment uses the light-emitting element described in Embodiment 1, and the light-emitting element has a device structure which can improve emission efficiency, in particular, can realize both improvement of emission efficiency and a long lifetime. Thus a highly reliable light-emitting device with reduced power consumption can be obtained.

Figure 4A:
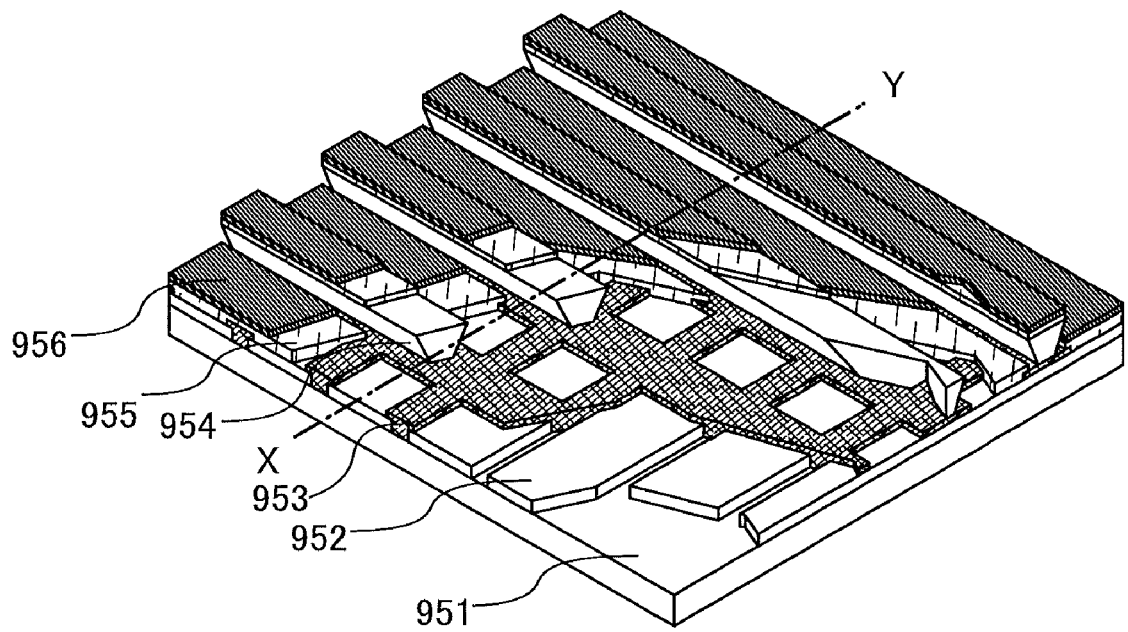
FIGS. 4A and 4B are a perspective view and a cross-sectional view, respectively, of a light-emitting device according to an embodiment of the present invention.
Figure 4B:
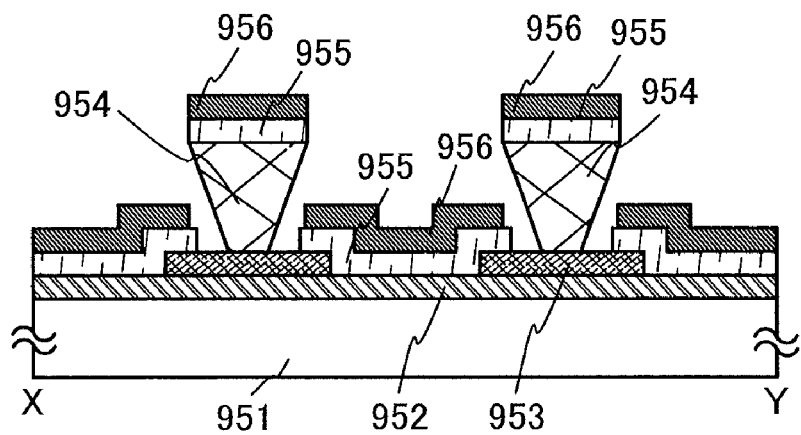

In this embodiment, an active matrix light-emitting device in which the driving of the light-emitting element is controlled by a transistor is described. However, a passive matrix light-emitting device may be adopted. FIGS. 4A and 4B illustrates a passive matrix light-emitting device formed according to the present invention. FIG. 4A is a perspective view of the light-emitting device, and FIG. 4B is a cross-sectional view taken along a line X-Y in FIG. 4A. In FIGS. 4A and 4B, over a substrate 951, a layer 955 containing an organic compound is provided between an electrode 952 and an electrode 956. An end portion of the electrode 952 is covered with an insulating layer 953. A partition layer 954 is formed over the insulating layer 953. Sidewalls of the partition layer 954 are slanted such that a distance between one of the sidewalls and the other becomes narrower toward a substrate surface. In other words, a cross section of the partition layer 954 in the short side direction is trapezoidal, and a base (a side which is parallel to a plane direction of the insulating layer 953 and is in contact with the insulating layer 953) is shorter than an upper side (a side which is parallel to a plane direction of the insulating layer 953 and is not in contact with the insulating layer 953). The partition layer 954 provided in this manner can facilitates patterning of the electrode 956. Also, a passive matrix light-emitting device can be manufactured by using the light-emitting element described in Embodiment 1. The use of the light-emitting element with the element structure which can improve emission efficiency, in particular, can realize both improvement of emission efficiency and a long lifetime allows the formation of a light-emitting device with reduced power consumption and improved reliability.

Embodiment 3

In this embodiment, electronic devices which include, as a part thereof, the light-emitting device described in Embodiment 2 will be described. These electronic devices each have a display portion including the light-emitting element described in Embodiment 1.

Examples of the electronic devices having the light-emitting element described in Embodiment 1 include cameras such as video cameras or digital cameras, goggle type displays, navigation systems, audio reproducing devices (e.g., car audio components and audio components), computers, game machines, portable information terminals (e.g., mobile computers, cellular phones, portable game machines, and electronic books), and image reproducing devices provided with recording media (specifically, the devices which can reproduce content of a recording medium such as a digital versatile disc (DVD) and is provided with a display device which is capable of displaying the reproduced images), and the like. Specific examples of these electronic devices are illustrated in FIGS. 5A to 5D.

Figure 5A:
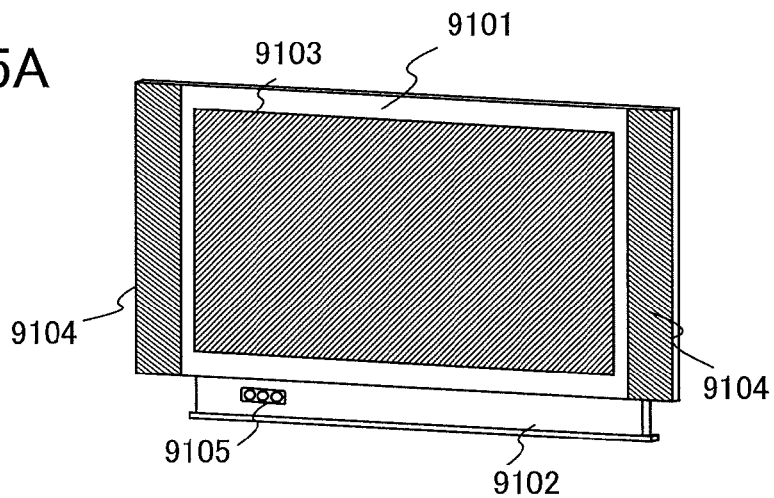
FIGS. 5A to 5D each illustrate an electronic device according to an embodiment of the present invention.

FIG. 5A illustrates a television set of the present invention that includes a housing 9101, a supporting base 9102, a display portion 9103, speaker portions 9104, video input terminals 9105, and the like. In this television set, the display portion 9103 is manufactured using the light-emitting element described in Embodiment 1 as a display element. The television set manufactured by using the light-emitting element with the element structure that can improve emission efficiency, in particular, realize both improvement of emission efficiency and a long lifetime can realize low power consumption of the display portion 9103, especially both low power consumption and higher reliability. The television set having the display portion 9103 can realize low power consumption, especially both improvement of low power consumption and higher reliability. In addition, since the television set using the light-emitting element having an improved lifetime can greatly reduce or downsize a functional circuitry for deterioration compensation, design or layout can be done more freely.

Figure 5B:
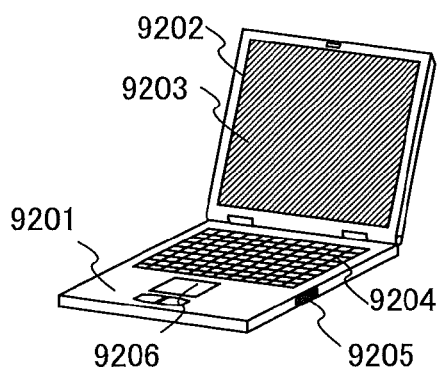

FIG. 5B illustrates a computer of the present invention, which includes a main body 9201, a housing 9202, a display portion 9203, a keyboard 9204, an external connection port 9205, a pointing device 9206, and the like. In this computer, the display portion 9203 is manufactured using the light-emitting element described in Embodiment 1 as a display element. The computer manufactured by using the light-emitting element with the element structure that can improve emission efficiency, in particular, realize both improvement of emission efficiency and a long lifetime can realize low power consumption of the display portion 9203, especially both low power consumption and higher reliability. The computer having the display portion 9203 can realize low power consumption, especially both low power consumption and higher reliability. In addition, since the computer using the light-emitting element having an improved lifetime can greatly reduce or downsize a functional circuitry for deterioration compensation used for the display portion, the computer can be downsized and light.

Figure 5C:
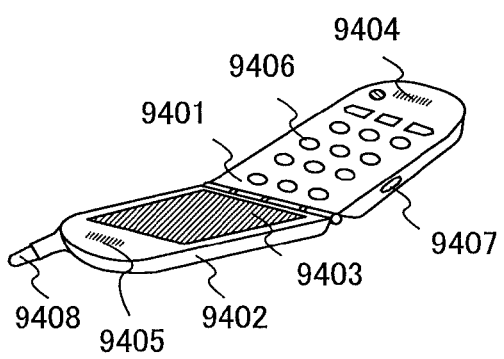

FIG. 5C illustrates a cellular phone, which includes a main body 9401, a housing 9402, a display portion 9403, an audio input portion 9404, an audio output portion 9405, operation keys 9406, an external connecting port 9407, an antenna 9408, and the like. In this cellular phone, the display portion 9403 is manufactured using the light-emitting element described in Embodiment 1 as a display element. The display portion 9403 manufactured by using the light-emitting element with the element structure that can improve emission efficiency, in particular, realize both improvement of emission efficiency and a long lifetime can realize low power consumption, especially both low power consumption and higher reliability. The cellular phone having the display portion 9403 can realize low power consumption, especially both low power consumption and higher reliability. This is advantageous for the cellular phone that is always to be carried. In addition, since the cellular phone having the display portion formed using the light-emitting element having an improved lifetime can greatly reduce or downsize a functional circuitry for deterioration compensation used for the display portion, the cellular phone can be more downsized. The downsized cellular phone in this embodiment can have a size and weight suitable for portable phones, even when various additional values are added to the cellular phone, and can have a structure for a high functional cellular phone.

Figure 5D:
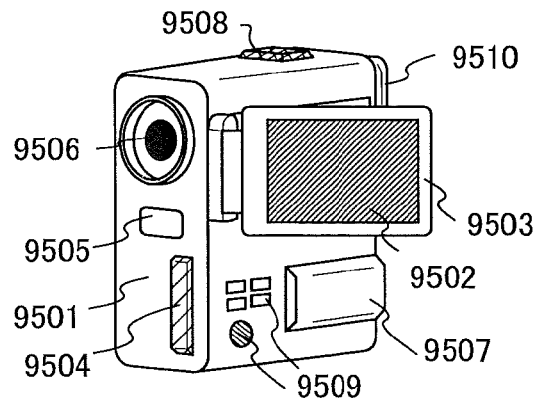

FIG. 5D illustrates a camera of the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In this camera, the display portion 9502 is manufactured using the light-emitting element described in Embodiment 1 as a display element. The display portion 9502 manufactured by using the light-emitting element with the element structure that can improve emission efficiency, in particular, realize both improvement of emission efficiency and a long lifetime can realize low power consumption, especially both improvement of emission efficiency and higher reliability. The camera having the display portion 9502 can realize low power consumption, especially both low power consumption and higher reliability. This is advantageous for the camera that is frequently to be carried. In addition, since the camera having the display portion formed using the light-emitting element having an improved lifetime can greatly reduce or downsize a functional circuitry for deterioration compensation used for the display portion, the camera can be more downsized.

As described above, the application range of the light-emitting device manufactured using the light-emitting element described in Embodiment 1 is so wide that the light-emitting device can be applied to electronic devices of a wide variety of fields.

In addition, the light-emitting device of the present invention can also be used for a lighting device. One mode of application of the light-emitting element described in Embodiment 1 to a lighting device will be described with reference to FIG. 6.

Figure 6:
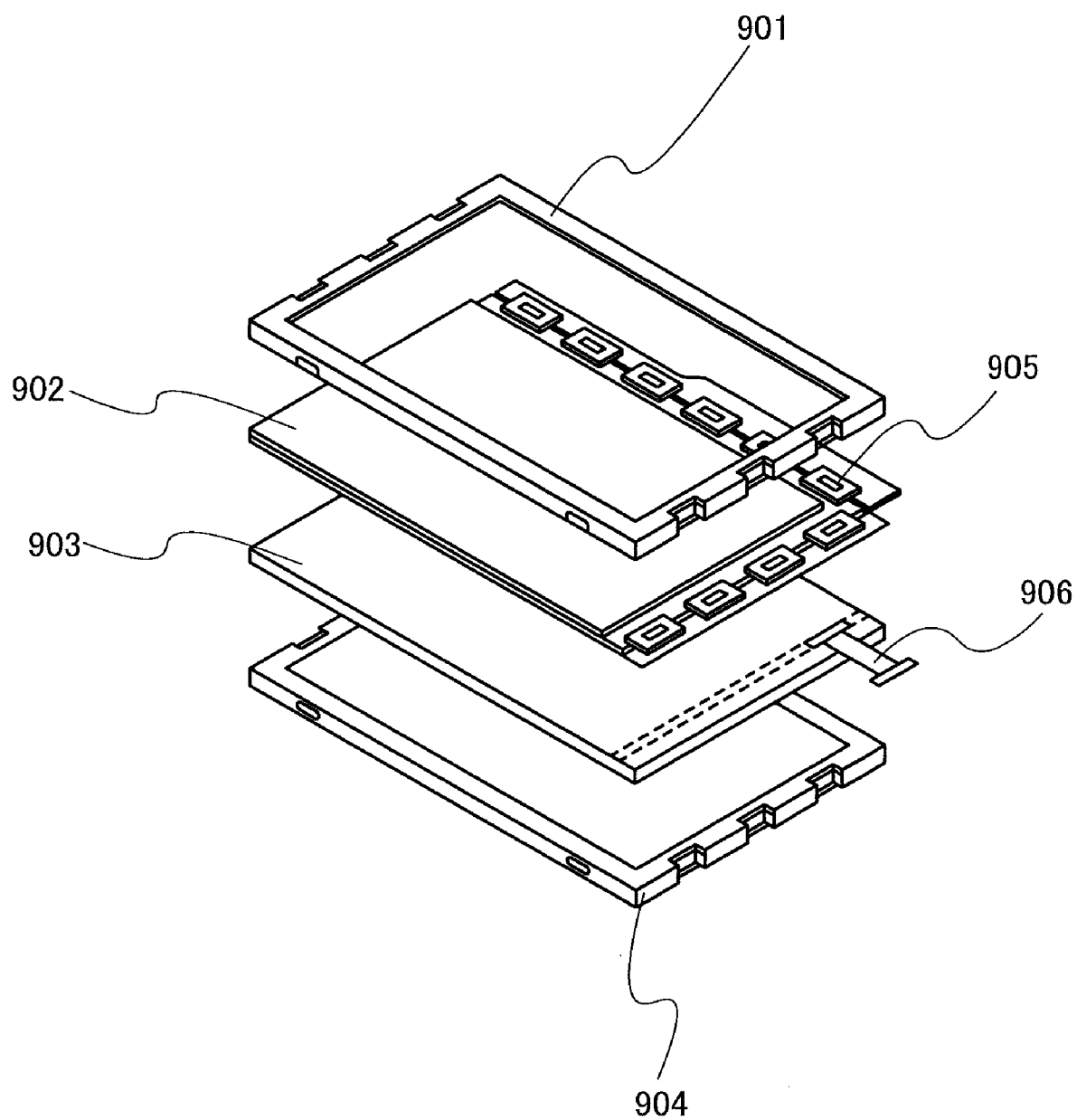
FIG. 6 illustrates an electronic device according to an embodiment of the present invention.

FIG. 6 illustrates an example of a liquid crystal display device in which the light-emitting element described in Embodiment 1 or Embodiment 2 is applied as a backlight. The liquid crystal display device illustrated in FIG. 6 includes a housing 901, a liquid crystal layer 902, a backlight unit 903, and a housing 904. The liquid crystal layer 902 is connected to a driver IC 905. In addition, the backlight unit 903 is formed using the light-emitting element described in Embodiment 1, and current is supplied thereto through a terminal 906.

Note that only one light-emitting element described in Embodiment 1 or a plurality of light-emitting elements described in Embodiment 1 may be used for the backlight unit 903.

As described above, the light-emitting element described in Embodiment 1 can be applied to the backlight of the liquid crystal display device. The area of the backlight can be increased, and thus the area of the liquid crystal display device can also be increased. The backlight manufactured by using the light-emitting element with the element structure that can improve emission efficiency, in particular, realize both improvement of emission efficiency and a long lifetime can realize low power consumption, especially both improvement of emission efficiency and higher reliability. Further, the backlight does not use a thick component, and thus the whole liquid crystal display device can be made thin.

Figure 7:
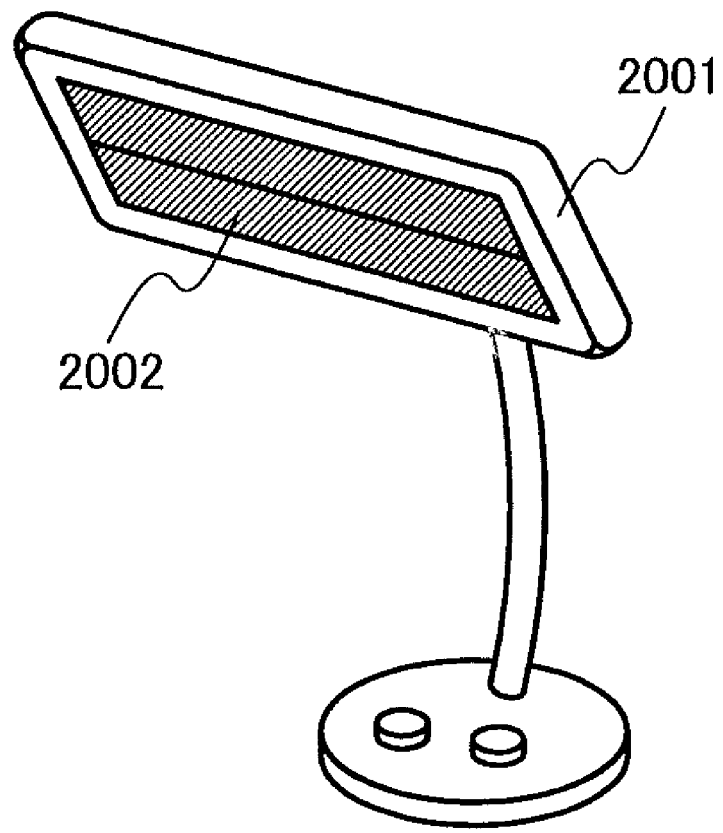
FIG. 7 illustrates an electronic device according to an embodiment of the present invention.

FIG. 7 shows an example in which the light-emitting element described in Embodiment 1 is used for a desk lamp which is a lighting device. The desk lamp shown in FIG. 7 includes a housing 2001 and a light source 2002, and the light-emitting element described in Embodiment 1 is used for the light source 2002. The light source 2002 may include one light-emitting element or a plurality of light-emitting elements described above. Alternatively, the light source 2002 may include the light-emitting element described in Embodiment 1 and another light-emitting element. Alternatively, the light source 2002 may include plural types of light-emitting elements which emit different colors. The desk lamp manufactured by using the light-emitting element with the structure that can improve emission efficiency, in particular, realize both improvement of emission efficiency and a long lifetime can realize low power consumption, especially both improvement of emission efficiency and higher reliability.

Figure 8:
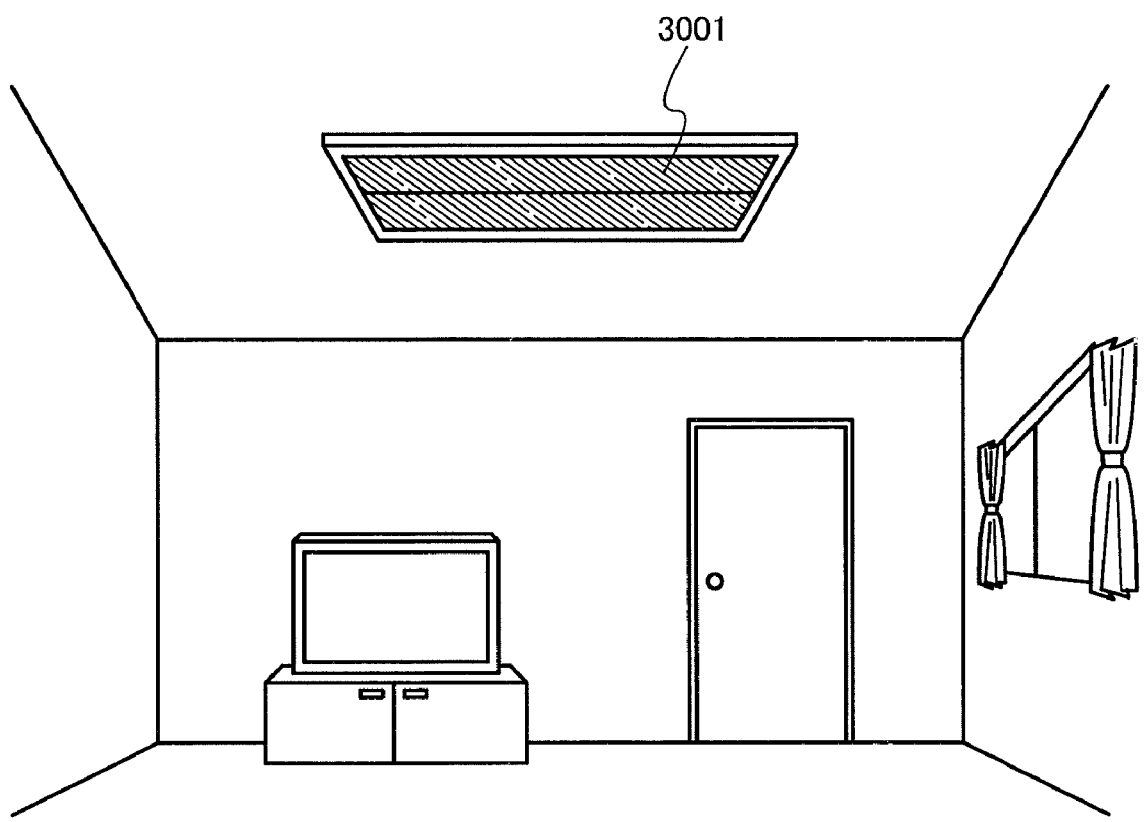
FIG. 8 illustrates an electronic device according to an embodiment of the present invention.

FIG. 8 illustrates an example in which the light-emitting element described in Embodiment 1 is used for an indoor lighting device 3001. The lighting device 3001 may include one light-emitting element or a plurality of light-emitting elements described above. The lighting device 3001 may include one light-emitting element or a plurality of light-emitting elements described above. Alternatively, the lighting device 3001 may include the light-emitting element described in Embodiment 1 and another light-emitting element. Alternatively, the lighting device 3001 may include plural types of light-emitting elements which emit different colors. As described above, the lighting device 3001 can be manufactured using the light-emitting element described in Embodiment 1. The area of the lighting device 3001 formed using the light-emitting element can be increased, and thus it can be used as a large area lighting device. The lighting device manufactured by using the light-emitting element with the element structure that can improve emission efficiency, in particular, realize both improvement of emission efficiency and a long lifetime can realize low power consumption, especially both improvement of emission efficiency and higher reliability.

Example 1

Light-emitting elements of an embodiment of the present invention are described, referring to results of reference light-emitting elements.

Molecular structures of organic compounds used in Example 1 are represented by the following structural formulae (1) and (4) to (7). The element structure is the same one as that of FIG. 1B.

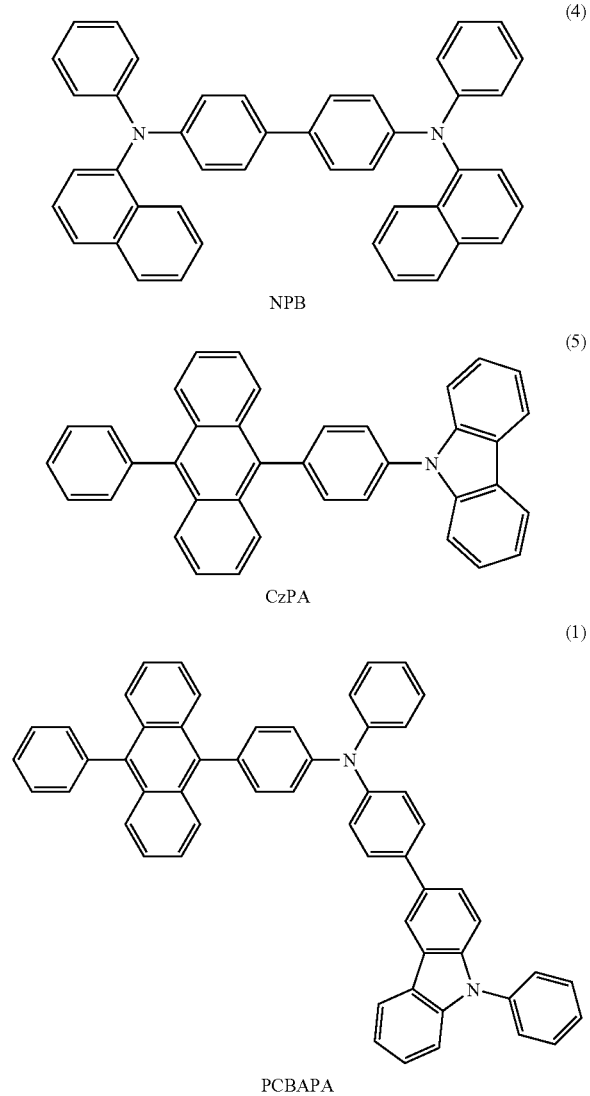

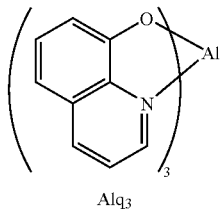

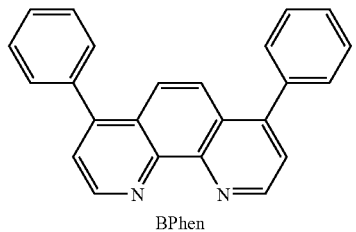

<<Manufacture of a Light-Emitting Element 1 and a Reference Light-Emitting Element 1>>

First, a glass substrate over which indium tin silicon oxide (ITSO) was formed with a thickness of 110 nm as an anode 100 was prepared. The periphery of surface of the ITSO was covered with a polyimide film so that an area of 2 mm×2 mm of the surface was exposed. The electrode area was 2 mm×2 mm. As a pretreatment for forming the light-emitting element over the substrate, the surface of the substrate was washed with water, and baked at 200° C. for one hour, then, a UV ozone treatment was conducted for 370 seconds. Then, the substrate was transferred into a vacuum deposition apparatus whose pressure was reduced to about $10^{-4}$ Pa, and vacuum baking at 170° C. for 30 minutes was conducted in a heating chamber of the vacuum deposition apparatus, and then the substrate was cooled down for about 30 minutes.

Then, the substrate was fixed on a holder provided in a vacuum deposition apparatus such that the surface of the substrate provided with ITSO faces down.

After pressure in the vacuum deposition apparatus was reduced to $10^{-4}$ Pa, 4,4'-bis[N-(1-naphthyl)-N-phenylamino] biphenyl (abbreviation: NPB) represented by the above structural formula (4) and molybdenum(VI) oxide were co-deposited so as to meet a ratio of NPB:molybdenum(VI) oxide=4:1 (mass ratio), whereby the hole-injecting layer 104 was formed. The thickness of the hole-injecting layer 104 was 50 nm. It is to be noted that the co-evaporation is an evaporation method in which a plurality of substances different from each other is simultaneously evaporated from evaporation sources different from each other. Next, NPB was deposited to be 10 nm thick, whereby the hole-transporting layer 105 was formed.

Further, the light-emitting layer 102 was formed over the hole-transporting layer 105. At this time, in the light-emitting element 1, the light-emitting layer 102 had a two layer structure of the first light-emitting layer 102a and the second light-emitting layer 102b, while only in the reference light-emitting element 1, the light-emitting layer 102 was a single layer of the second light-emitting layer 102b without forming the first light-emitting layer 102a.

In the light-emitting element 1, the first light-emitting layer 102a was formed over the hole-transporting layer 105 first. 4-(10-phenyl-9-anthryl)-4'-(9-phenyl-9H-carbazol-3-yl) triphenylamine (abbreviation: PCBAPA) represented by the structural formula (1) was deposited to form the first light-emitting layer 102a. The thickness of the first light-emitting layer 102a was 30 nm.

Then, the second light-emitting layer 102b was formed over the hole-transporting layer in the reference light-emitting element 1 by co-deposition of CzPA and PCBAPA, and the second light-emitting layer 102b was formed over the first light-emitting layer 102a in the light-emitting element 1 by co-deposition of CzPA and PCBAPA. Note that the mass ratio between CzPA and PCBAPA in the second light-emitting layer 102b was CzPA:PCBAPA=1:0.1 in both the light-emitting element 1 and the reference light-emitting element 1. The thickness of the second light-emitting layer 102b was 30 nm.

Next, tris(8-quinolinolato)aluminum(III) (abbreviation: Alq) represented by the structural formula (6) was deposited to 10 nm thick and then bathophenanthroline (abbreviation: BPhen) represented by the structural formula (7) was deposited to 20 nm thick, so that the electron-transporting layer 106 was formed. The electron-injecting layer 107 was formed using lithium fluoride to 1 nm thick over the electron-transporting layer 106. Lastly, a 200-nm-thick aluminum film was deposited as the second electrode serving as a cathode 101. In this manner, the light-emitting elements were completed. The above-described deposition steps were all made by a resistance heating method.

<<Operative Characteristics of the Light-Emitting Element 1 and the Reference Light-Emitting Element 1>>

The thus obtained light-emitting element 1 and the reference light-emitting element 1 were put into a glove box under a nitrogen atmosphere so that the light-emitting elements were sealed from atmospheric air. Then, the operating characteristics of the light-emitting elements were measured. The measurement was carried out at a room temperature (in the atmosphere kept at 25° C.).

Figure 9:
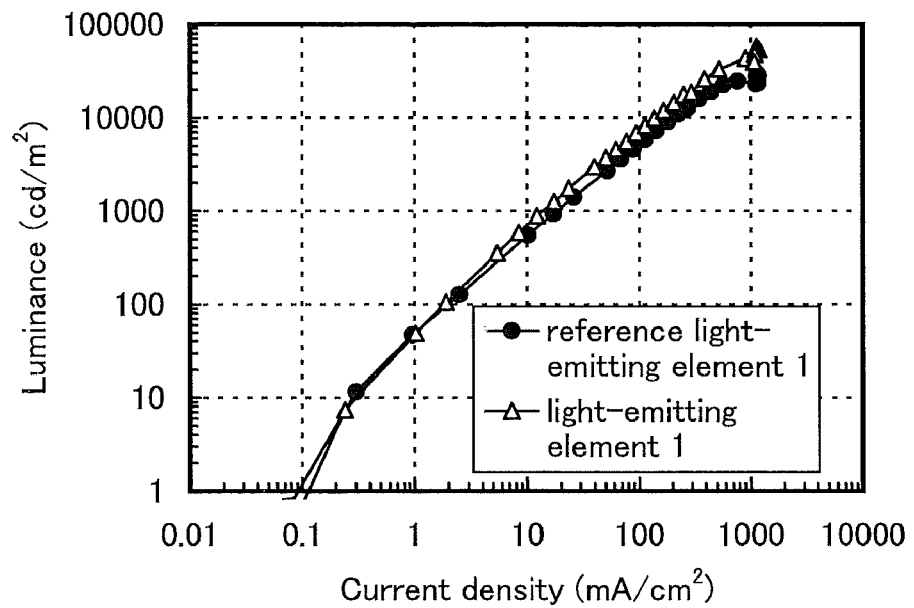
FIG. 9 is a graph of current density vs. luminance characteristics of a light-emitting element 1 and a reference light-emitting element 1 (Example 1)
Figure 10:
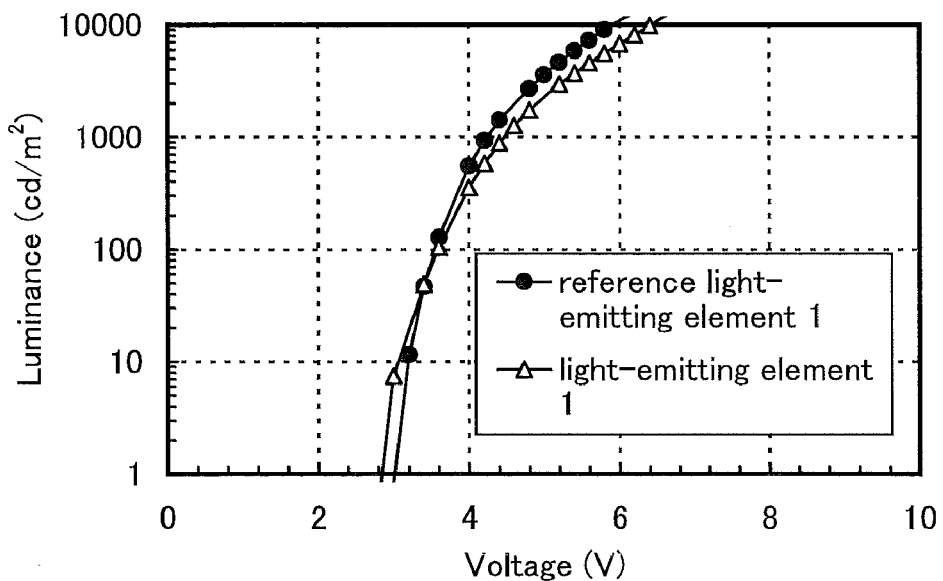
FIG. 10 is a graph of voltage vs. luminance characteristics of the light-emitting element 1 and the reference light-emitting element 1 (Example 1)
Figure 11:
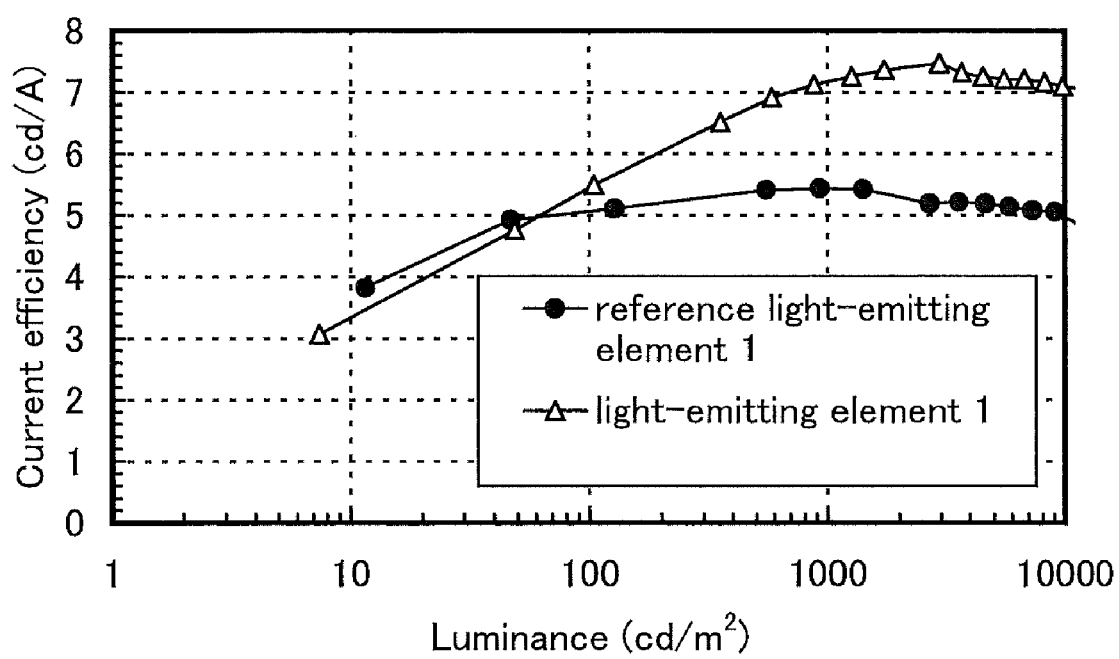
FIG. 11 is a graph of luminance vs. current efficiency characteristics of the light-emitting element 1 and the reference light-emitting element 1 (Example 1)

Current density vs. luminance characteristics, voltage vs. luminance characteristics, and luminance vs. current efficiency characteristics of the light-emitting elements are shown in FIGS. 9, 10, and 11, respectively.

Current efficiencies of the reference light-emitting element 1 and the light-emitting element 1 near 1000 cd/m² were 5.43 cd/A (at 929 cd/m²) and 7.12 cd/A (at 881 cd/m²), respectively. The result shows that the light-emitting element 1 described in Embodiment 1 has emission efficiency higher than the reference light-emitting element 1. It is thought that this is because electrons that are not recombined in the second light-emitting layer 102b and do not contribute to light emission are recombined with holes in the first light-emitting layer 102a, and the first substance in the first light-emitting layer 102a emits light. CIE color coordinates of the light-emitting element 1 was (x=0.16, y=0.19) and CIE color coordinates of the reference light-emitting element 1 was (x=0.15, y=0.21). The both light-emitting elements exhibited blue emission with excellent color purity.

Figure 12:
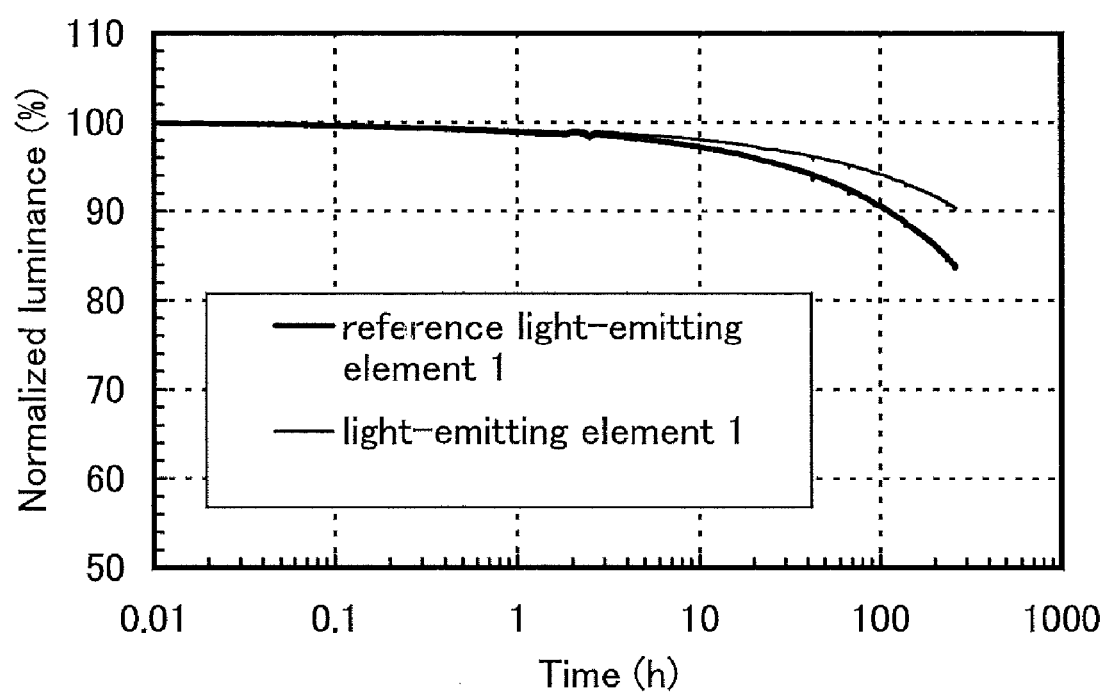
FIG. 12 is a graph of luminance degradation curves of the light-emitting element 1 and the reference light-emitting element 1 (Example 1)

Next, the initial luminance was set to be 1000 cd/m², and these elements were driven at a constant current density. As a result, luminance degradation curves as seen in FIG. 12 were obtained. FIG. 12 is a graph in which the horizontal axis represents time and the vertical axis represents relative luminance (%) when the initial luminance is regarded as 100%. As apparent from FIG. 12, the luminance of the reference light-emitting element 1 was reduced to 84% of the initial luminance by driving for 260 hours. On the other hand, the luminance of the light-emitting element 1 was reduced only to 90% of the initial luminance, which indicates that the light-emitting element of the present invention has an improved lifetime.

As described above, the light-emitting element of the present invention with improved emission efficiency can be provided by the present invention. Further, the light-emitting element that realize both improvement of emission efficiency and a long lifetime can be provided.

Example 2

In Example 2, a light-emitting element of the present invention having a different structure from that in Examples 1 is described, referring to results of a reference light-emitting element. A molecular structure of one of organic compounds used in Example 2 are shown below. Note that the organic compounds whose molecular structures are described in another example are not described in this example. The element structure in Example 2 is similar to that in Example 1, about which FIG. 1B is referred to.

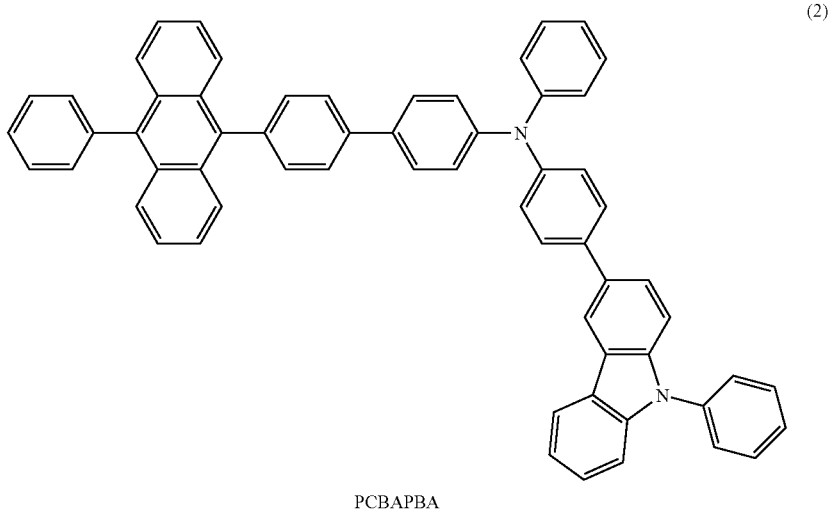

(2)

PCBAPBA

<<Manufacture of the Light-Emitting Element 2 and the Reference Light-Emitting Element 2>>

The light-emitting element 2 and the reference light-emitting element 2 were formed in a similar manner to the light-emitting element 1, including and up to formation of the hole-transporting layer 105.

Then, the light-emitting layers 102 were formed. In the light-emitting element 2, the light-emitting layer 102 was formed to have a stack structure in which the second light-emitting layer 102b was formed over the first light-emitting layer 102a similarly to the light-emitting element 1 in Example 1, while in the reference light-emitting element 2, the light-emitting layer 102 was formed to have a single layer structure of the second light-emitting layer 102b without forming the first light-emitting layer 102a similarly to the reference light-emitting element 1 in Example 1.

The first light-emitting layer 102a was formed over the hole-transporting layer by deposition of 4-[4-(10-phenyl-9-anthryl)phenyl]-4'-(9-phenyl-9H-carbazol-3-yl)triphenylamine (abbreviation: PCBAPBA) represented by the structural formula (2). The thickness of the first light-emitting layer 102a was 30 nm. Then, the second light-emitting layer 102b was formed over the hole-transporting layer 105 in the reference light-emitting element 2 by co-deposition of CzPA and PCBAPBA, and the second light-emitting layer 102b was formed over the first light-emitting layer 102a in the light-emitting element 2 by co-deposition of CzPA and PCBAPBA. In both cases of the light-emitting element 2 and reference light-emitting element 2, the mass ratio between CzPA and PCBAPBA in the second light-emitting layer 102b was set to be CzPA:PCBAPBA=1:0.1. The thickness of the second light-emitting layer 102b was 30 nm.

Next, a 10-nm-thick Alq and then a 20-nm-thick BPhen were deposited as the electron-transporting layer 106. The electron-injecting layer 107 was formed using lithium fluoride to 1 nm thick over the electron-transporting layer 106. Lastly, a 200-nm-thick aluminum film was deposited as the second electrode serving as a cathode 101. In this manner, the light-emitting elements were completed. The above-described deposition steps were all performed by a resistance heating method.

<<Operative Characteristics of the Light-Emitting Element 2 and the Reference Light-Emitting Element 2>>

The thus obtained light-emitting element 2 and the reference light-emitting element 2 were put into a glove box under a nitrogen atmosphere so that the light-emitting elements were sealed from atmospheric air. Then, the operating characteristics of the light-emitting elements were measured. The measurement was carried out at a room temperature (in the atmosphere kept at 25° C.).

Figure 13:
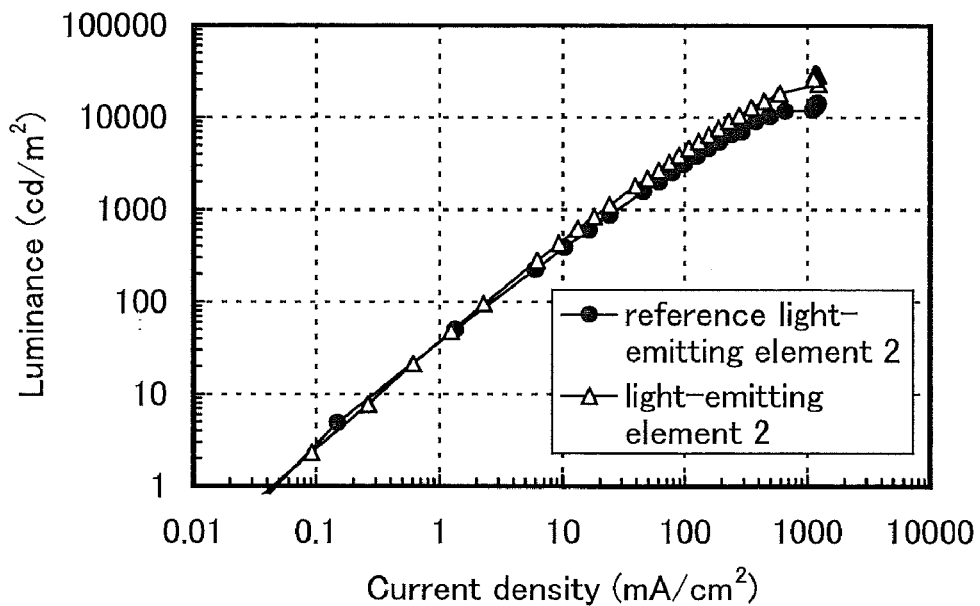
FIG. 13 is a graph of current density vs. luminance characteristics of a light-emitting element 2 and a reference light-emitting element 2 (Example 2)
Figure 14:
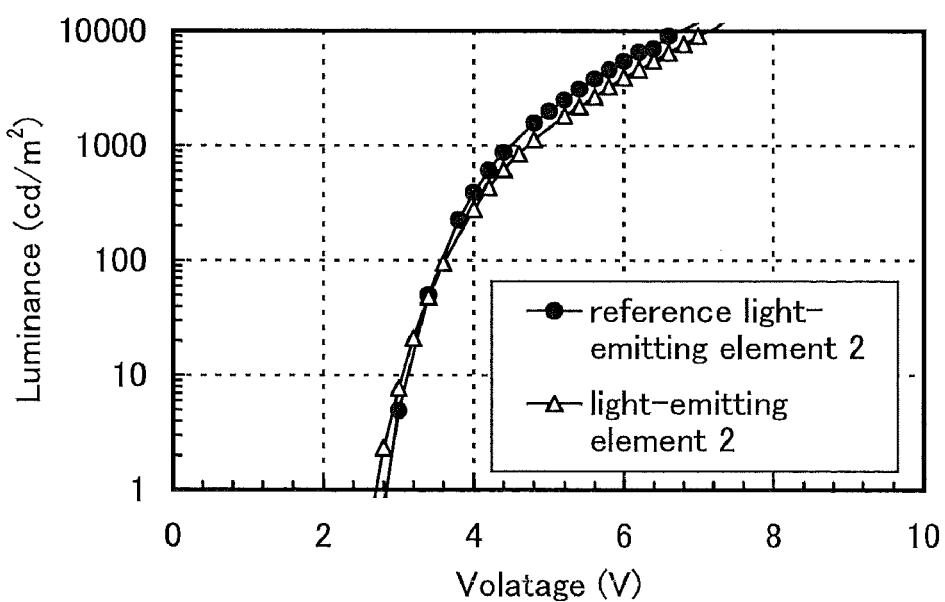
FIG. 14 is a graph of voltage vs. luminance characteristics of the light-emitting element 2 and the reference light-emitting element 2 (Example 2)
Figure 15:
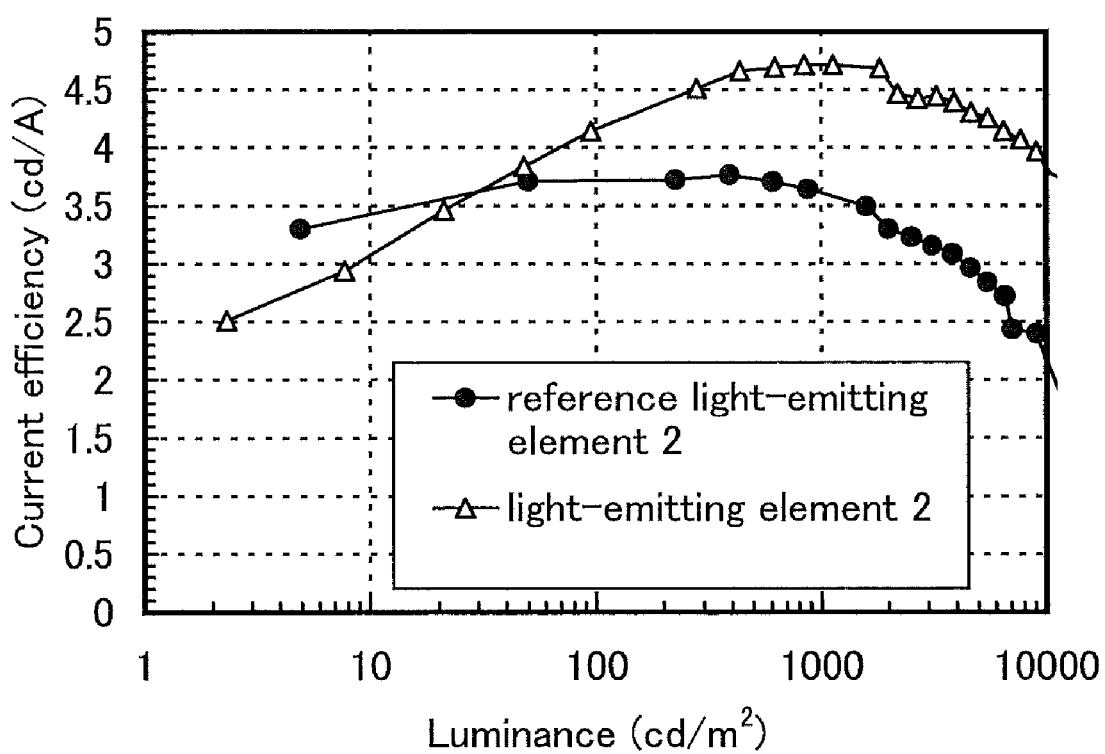
FIG. 15 is a graph of luminance vs. current efficiency characteristics of the light-emitting element 2 and the reference light-emitting element 2 (Example 2)

Current density vs. luminance characteristics, voltage vs. luminance characteristics, and luminance vs. current efficiency characteristics of the light-emitting elements are shown in FIGS. 13, 14, and 15, respectively.

Current efficiencies of the reference light-emitting element 2 and the light-emitting element 2 near 1000 cd/m$^2$ were 3.64 cd/A (at 873 cd/m$^2$) and 4.74 cd/A (at 1130 cd/m$^2$), respectively. The result shows that the light-emitting element 2 having the structure described in Embodiment 1 has current efficiency higher than the reference light-emitting element 2 which does not have the structure. It is thought that this is because electrons that are not recombined in the second light-emitting layer 102b and do not contribute to light emission are recombined with holes in the first light-emitting layer 102a, and the first substance in the first light-emitting layer 102a emits light. CIE color coordinates of the light-emitting element 2 was (x=0.16, y=0.14) and CIE color coordinates of the reference light-emitting element 2 was (x=0.16, y=0.16). The both light-emitting elements exhibited blue emission with excellent color purity.

Figure 16:
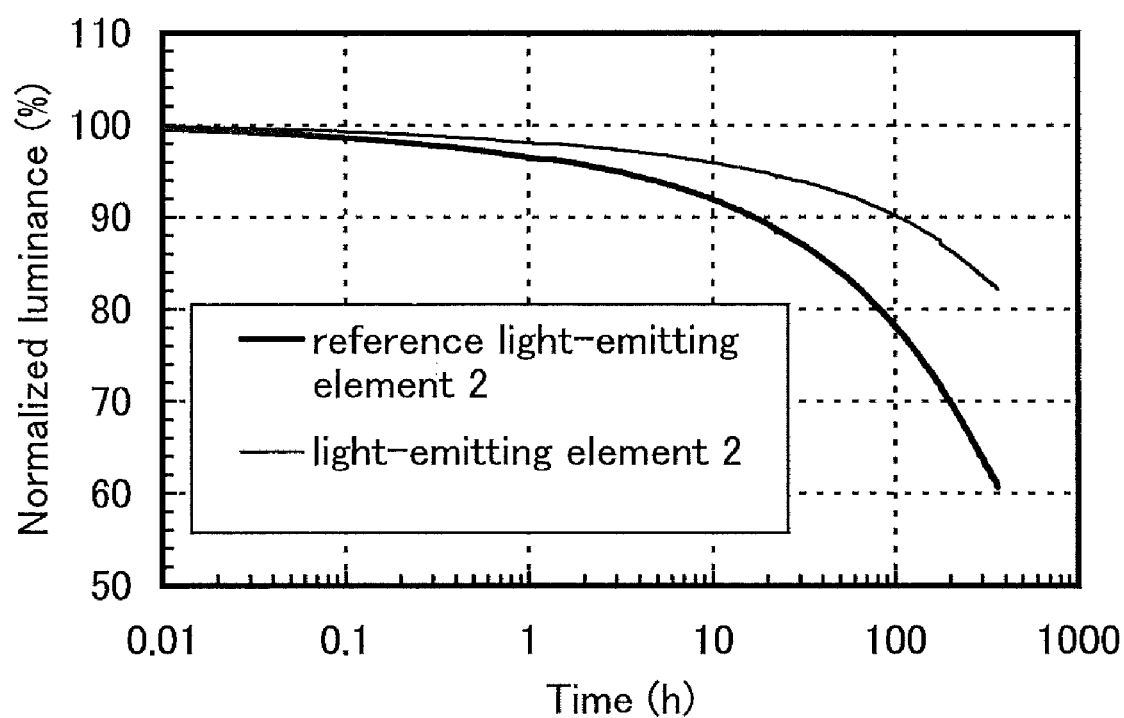
FIG. 16 is a graph of luminance degradation curves of the light-emitting element 2 and the reference light-emitting element 2 (Example 2)

Next, the initial luminance was set at 1000 cd/m$^2$, and these elements were driven at the constant current density. As a result, luminance degradation curves as seen in FIG. 16 were obtained. FIG. 16 is a graph in which the horizontal axis represents time and the vertical axis represents relative luminance (%) when the initial luminance is regarded as 100%. As apparent from FIG. 16, the luminance of the reference light-emitting element 2 was reduced to 61% of the initial luminance by driving for 360 hours. On the other hand, the luminance of the light-emitting element 2 was reduced to 82% of the initial luminance, which indicates that the light-emitting element of the present invention have a greatly improved lifetime.

As described above, the present invention can provide a light-emitting element with improved emission efficiency. Further, the light-emitting element that realizes both improvement of emission efficiency and a long lifetime can be obtained.

Example 3

In Example 3, light-emitting elements of the present invention having different structures in Examples 1 and 2 are described, referring to results of reference light-emitting elements. A molecular structure of one of the organic compounds used in Example 3 is shown below. Note that the organic compounds whose molecular structures have been described in another example are not described in this example. The element structure in Example 3 is similar to that in Example 1, about which FIG. 1B is referred to.

(3)

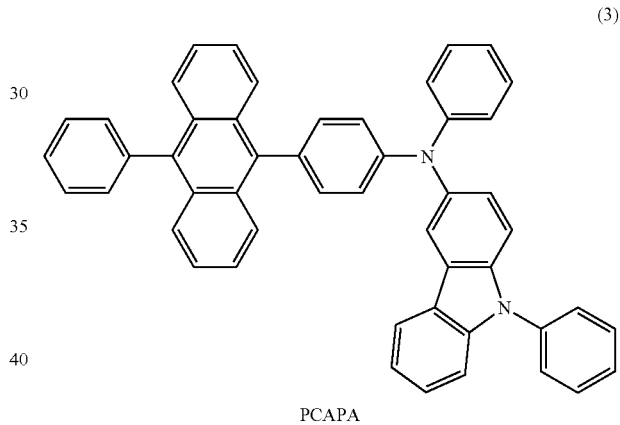

PCAPA

<<Manufacture of the Light-Emitting Element 3 and the Reference Light-Emitting Element 3>>

The light-emitting element 3 and the reference light-emitting element 3 were formed in a similar manner to the light-emitting element 1, including and up to formation of the hole-transporting layer 105.

Then, the light-emitting layers 102 were formed. In the light-emitting element 3, the light-emitting layer 102 was formed to have a stack structure in which the second light-emitting layer 102b was formed over the first light-emitting layer 102a similarly to the light-emitting element 1 in Example 1, while in the reference light-emitting element 3, the light-emitting layer 102 was formed to have a single layer structure of the second light-emitting layer 102b without forming the first light-emitting layer 102a similarly to the reference light-emitting element 1 in Example 1.

The first light-emitting layer 102a was formed over the hole-transporting layer using N,9-diphenyl-N-[4-(10-phenyl-9-anthryl)phenyl]-9H-carbazol-3-amine (abbreviation: PCAPA) represented by the structural formula (3). The thickness of the first light-emitting layer 102a was 30 nm. Then, the second light-emitting layer 102b was formed over the hole-transporting layer 105 in the reference light-emitting element 3 by co-deposition of CzPA and PCAPA, and the second light-emitting layer 102b was formed over the first light-emitting layer 102a in the light-emitting element 3 by co-deposition of CzPA and PCAPA. In both the light-emitting element 3 and the reference light-emitting element 3, the mass ratio between CzPA and PCAPA was set to be CzPA: PCAPA=1:0.1. The thickness of the second light-emitting layers 102b was 30 nm.

Next, a 10-nm-thick Alq was deposited over the light-emitting layer 102 and then a 20-nm-thick BPhen was formed, as the electron-transporting layer 106. The electron-injecting layer 107 was formed using lithium fluoride to 1 nm thick over the electron-transporting layer 106. Lastly, a 200-nm-thick aluminum film was deposited as the second electrode serving as a cathode 101. In this manner, the light-emitting elements were completed. The above-described deposition steps were all performed by a resistance heating method.

<<Operative Characteristics of the Light-Emitting Element 3 and the Reference Light-Emitting Element 3>>

The thus obtained light-emitting element 3 and the reference light-emitting element 3 were put into a glove box under a nitrogen atmosphere so that the light-emitting elements were sealed from atmospheric air. Then, the operating characteristics of the light-emitting elements were measured. The measurement was carried out at a room temperature (in the atmosphere kept at 25° C.).

Figure 17:
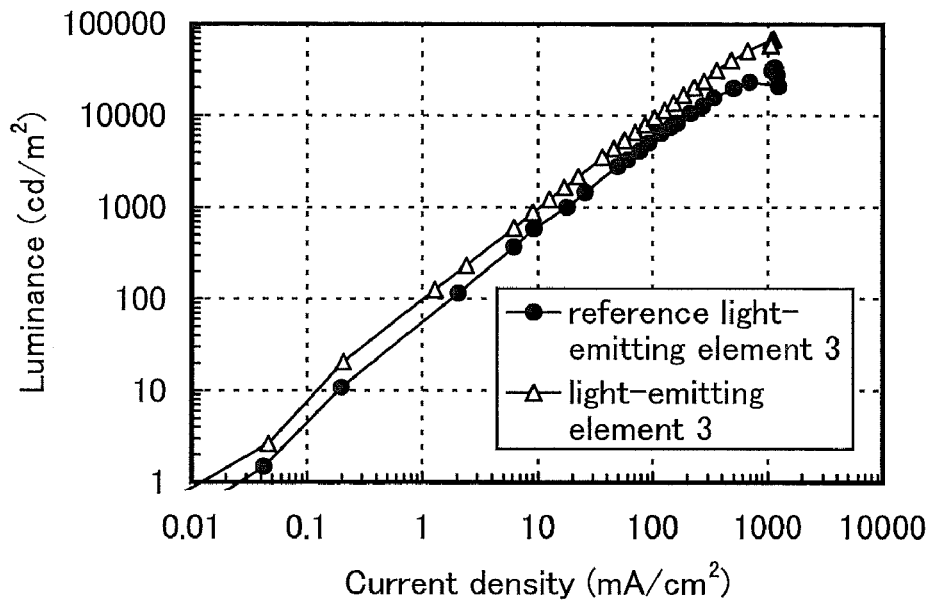
FIG. 17 is a graph of current density vs. luminance characteristics of a light-emitting element 3 and a reference light-emitting element 3 (Example 3)
Figure 18:
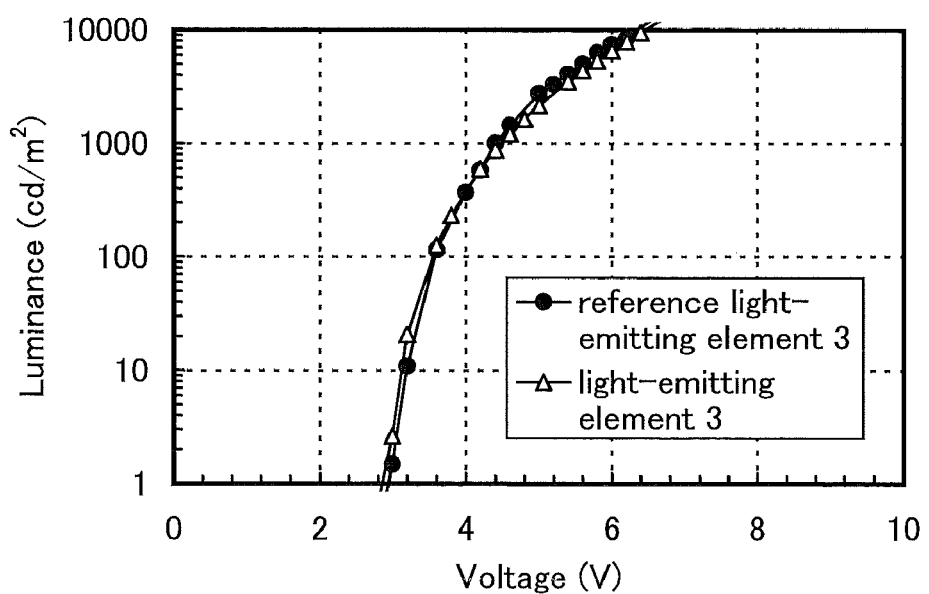
FIG. 18 is a graph of voltage vs. luminance characteristics of the light-emitting element 3 and the reference light-emitting element 3 (Example 3)
Figure 19:
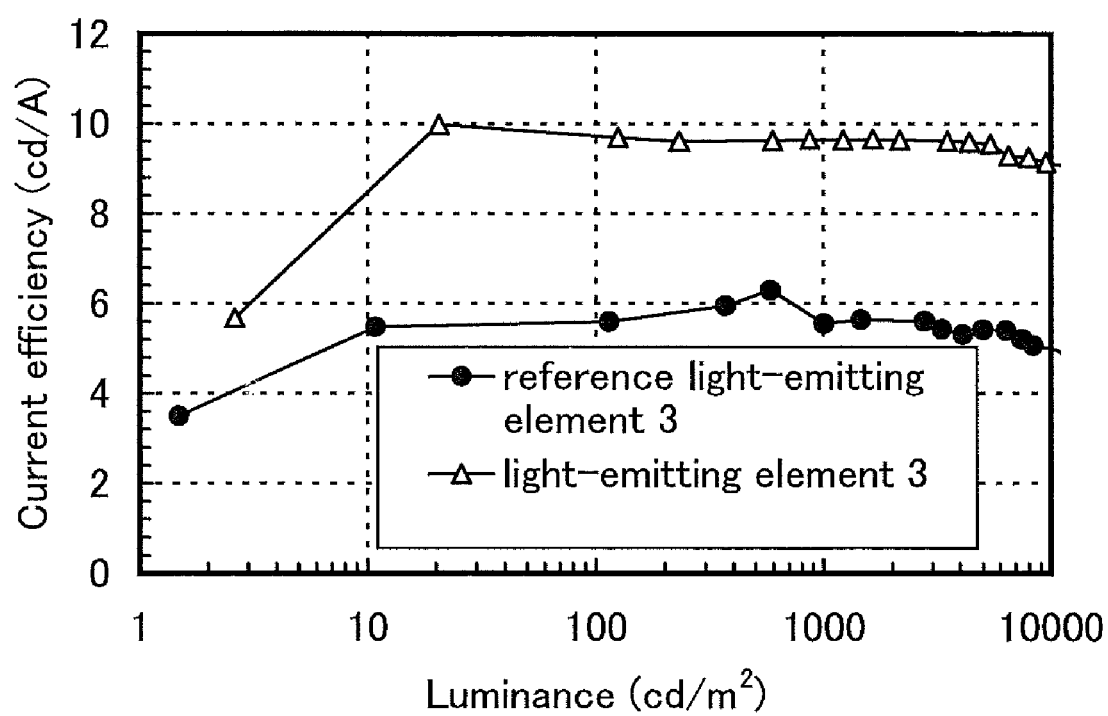
FIG. 19 is a graph of luminance vs. current efficiency characteristics of the light-emitting element 3 and the reference light-emitting element 3 (Example 3).

Current density-luminance characteristics, voltage-luminance characteristics, and luminance-current efficiency characteristics of the light-emitting elements are shown in FIGS. 17, 18, and 19, respectively.

Current efficiencies of the reference light-emitting element 3 and the light-emitting element 3 around 1000 cd/m$^2$ were 5.63 cd/A (at 1450 cd/m$^2$) and 9.65 cd/A (at 869 cd/m$^2$), respectively. The results show that the light-emitting element 3 that is the light-emitting element having the structure described in Embodiment 1 has higher current efficiency than the reference light-emitting element 3. It is thought that this is because electrons that are not recombined in the second light-emitting layer 102b and do not contribute to light emission are recombined with holes in the first light-emitting layer 102a, and the first substance in the first light-emitting layer 102a emits light.

Thus, the present invention can provide a light-emitting element with improved emission efficiency.

Reference Example

Synthesis methods of PCBAPA represented by the structural formula (1) used in Example 1 and PCBAPBA represented by the structural formula (2) used in Example 2 will now be described.

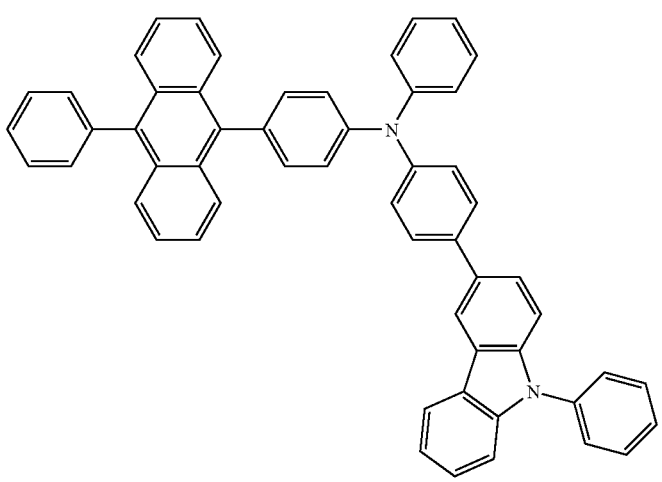

(1)

PCBAPA

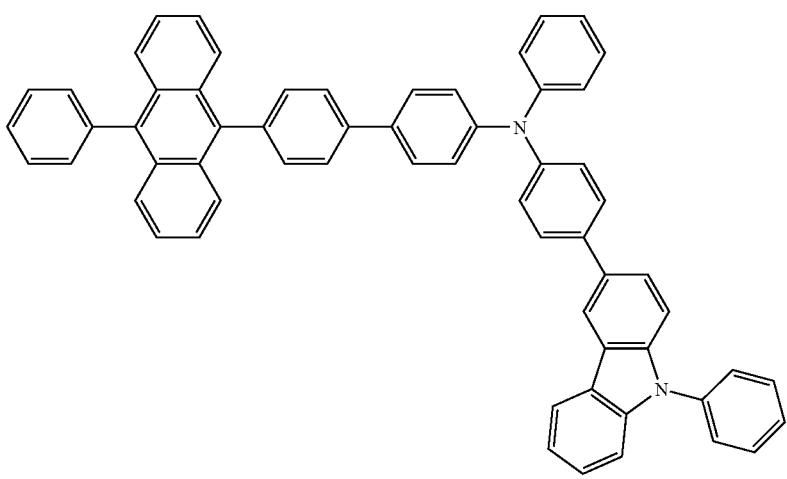

(2)

PCBAPBA

<<Synthesis Method of PCBAPA>>

Step 1: Synthesis of
9-phenyl-9H-carbazole-3-boronic acid 10 g (31 mmol) of 3-bromo-9-phenyl-9H-carbazole was put into a 500 mL three-neck flask, and the air in the flask was replaced with nitrogen. 150 mL of tetrahydrofuran (THF) was put into the flask, and 3-bromo-9-phenyl-9H-carbazole was dissolved therein. This solution was cooled down to −80° C. 20 mL (32 mmol) of n-butyllithium (a 1.58 mol/L hexane solution) was dropped into this solution with a syringe. After dropping, the solution was stirred at the same temperature for one hour. After the stirring, 3.8 mL (34 mmol) of trimethyl borate was added to the solution, and the solution was stirred for about 15 hours while the temperature of the solution was being raised to room temperature. After the stirring, about 150 mL (1.0 mol/L) of diluted hydrochloric acid was added to the solution, and then the solution was stirred for 1 hour. After stirring, an organic layer is separated from the mixture, the aqueous layer was extracted with ethyl acetate, and the extracted solution and the organic layer were combined and washed with saturated sodium bicarbonate. The combined organic layer was dried with magnesium sulfate. After the drying, the mixture was subjected to gravity filtration. The obtained filtrate was condensed to give an oily light brown substance. The obtained oily substance was dried under reduced pressure to give 7.5 g of a light brown solid, which was the object of the synthesis, in a yield of 86%. A synthesis scheme of Step 1 is shown by the following (a-1).

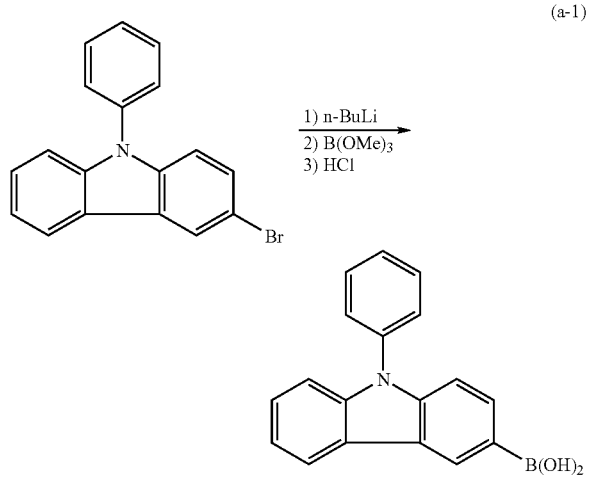

Step 2: Synthesis of
4-(9-phenyl-9H-carbazol-3-yl)diphenylamine
(PCBA)

Into a 500 mL three-neck flask were put 6.5 g (26 mmol) of 4-bromodiphenylamine, 7.5 g (26 mmol) of 9-phenyl-9H-carbazole-3-boronic acid, and 400 mg (1.3 mmol) of tri(o-tolyl)phosphine. The air in the flask was replaced with nitrogen. To the mixture were added 100 mL of toluene, 50 mL of ethanol, and 14 mL (0.2 mol/L) of an aqueous solution of potassium carbonate. Under reduced pressure, this mixture was degassed while being stirred. After the degassing, 67 mg (30 mmol) of palladium(II) acetate was added to the mixture. This mixture was refluxed at 100° C. for 10 hours. After the reflux, an organic layer of the mixture was separated, an aqueous layer was extracted with toluene, and the extracted solution was combined with the organic layer and then washed with a saturated saline solution. The combined organic layer was dried with magnesium sulfate. After the drying, this mixture was subjected to gravity filtration. The obtained filtrate was condensed to give an oily light brown substance. This oily substance was purified by silica gel column chromatography (a developing solvent was a mixed solvent of hexane:toluene=4:6). A white solid obtained after the purification was recrystallized with a mixed solution of dichloromethane and hexane to give 4.9 g of a white solid, which was the object of the synthesis, in a yield of 45%. A synthesis scheme of Step 2 is shown in (a-2) given below.

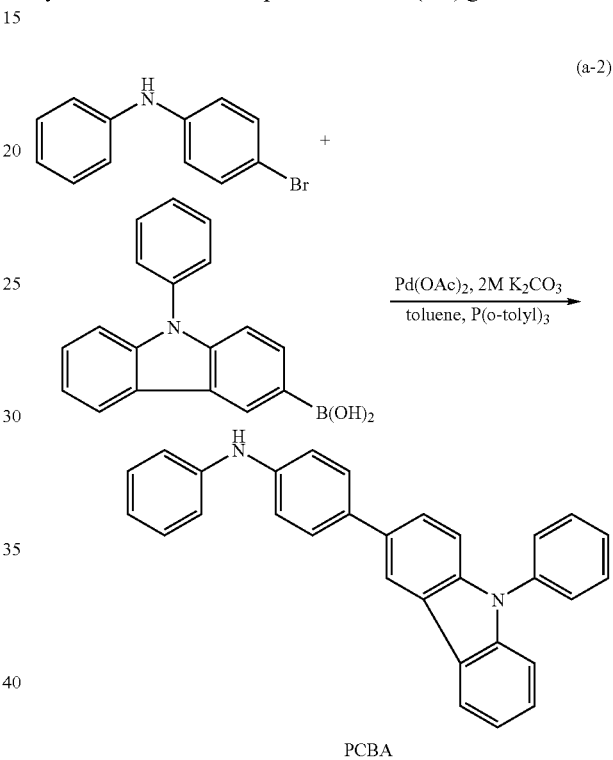

Note that the solid obtained in the above Step 2 was analyzed by nuclear magnetic resonance measurements (NMR). The measurement result is described below. The measurement result shows that PCBA serving as a source material to synthesize PCBAPA was obtained.

$^1$H NMR (DMSO-$d_6$, 300 MHz): δ=6.81-6.86 (m, 1H), 7.12 (dd, $J_1$=0.9 Hz, $J_2$=8.7 Hz, 2H), 7.19 (d, J=8.7 Hz, 2H), 7.23-7.32 (m, 3H), 7.37-7.47 (m, 3H), 7.51-7.57 (m, 1H), 7.61-7.73 (m, 7H), 8.28 (s, 1H), 8.33 (d, J=7.2 Hz, 1H), 8.50 (d, J=1.5 Hz, 1H)

Step 3: Synthesis of PCBAPA

Into a 300 mL three-neck flask were put 7.8 g (12 mmol) of 9-(4-bromophenyl)-10-phenylanthracene, 4.8 g (12 mmol) of PCBA, and 5.2 g (52 mmol) of sodium tert-butoxide. The air in the flask was replaced with nitrogen. To the mixture were added 60 mL of toluene and 0.30 mL of tri(tert-butyl)phosphine (a 10 wt % hexane solution). Under reduced pressure, this mixture was degassed while being stirred. After the degassing, 136 mg (0.24 mmol) of bis(dibenzylideneacetone) palladium(0) was added to the mixture. This mixture was stirred at 100° C. for 3 hours. After the stirring, about 50 mL of toluene was added to this mixture. The mixture was subjected to suction filtration through celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was condensed to give a yellow solid. This solid was recrystallized with a mixed solution of toluene and hexane to give 6.6 g of a light yellow solid PCBAPA, which was the object of the synthesis, in a yield of 75%. Then, 3.0 g of the obtained light yellow powdered solid was purified by train sublimation. For sublimation purification conditions, PCBAPA was heated at 350° C. under a pressure of 8.7 Pa with a flow rate of argon gas of 3.0 mL/min. After the sublimation purification, 2.7 g of a light yellow solid PCBAPA was obtained in a yield of 90%. A synthesis scheme of Step 3 is shown in (a-3) given below.

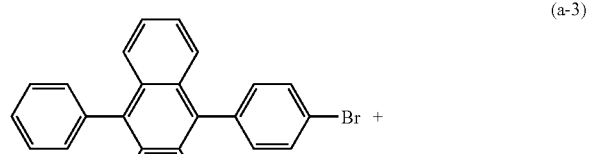

(a-3)

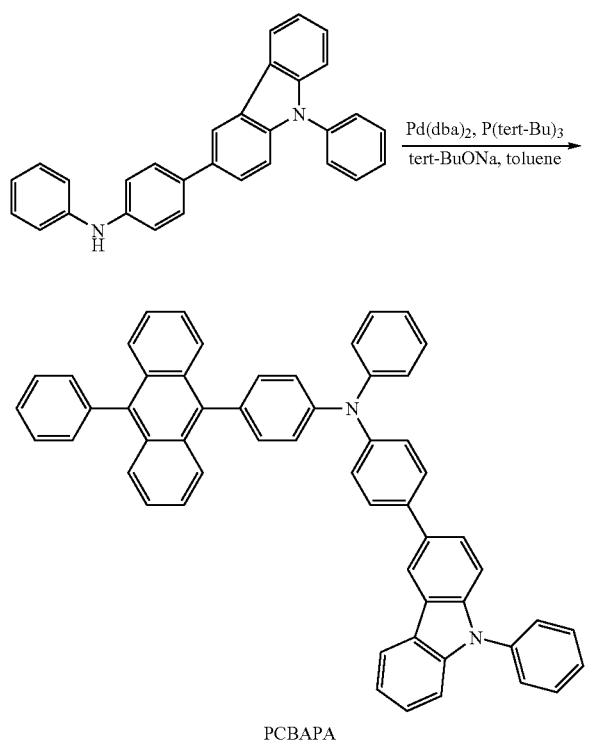

PCBAPA

The solid obtained in the above Step 3 was analyzed by $^1$H NMR. The measurement result is described below. The measurement result shows that PCBAPA was obtained.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H).

Next, a synthesis method of 4-[4-(10-phenyl-9-anthryl)phenyl]-4'-(9-phenyl-9H-carbazol-3-yl)triphenylamine (abbreviation: PCBAPBA) represented by the structural formula (2) is described.

<<Synthesis Method of PCBAPBA>>

Step 1: Synthesis of 9-(4'-bromobiphenyl-4-yl)-10-phenylanthracene

Into a 100 mL three-neck flask were put 2.8 g (7.2 mmol) of 9-iodo-10-phenylanthracene and 1.5 g (7.2 mmol) of 4'-bromobiphenyl-4-boronic acid. The air in the flask was replaced with nitrogen. To the mixture were added 40 mL of toluene and 10 mL (2.0 mol/L) of an aqueous solution of sodium carbonate. This mixture was stirred to be degassed while the pressure was being reduced. After the degassing, 120 mg (0.10 mmol) of tetrakis(triphenylphosphine)palladium(0) was added to the mixture. This mixture was stirred at 90° C. for 4 hours. After the stirring, about 50 mL of toluene was added to this mixture. The mixture was subjected to suction filtration through alumina, celite (produced by Wako Pure Chemical Industries, Ltd., Catalog No. 531-16855), and Florisil (produced by Wako Pure Chemical Industries, Ltd., Catalog No. 540-00135). The solid obtained by condensation of the obtained filtrate was purified by high-performance liquid chromatography (a mobile phase: chloroform) to give a light yellow solid. The obtained solid was recrystallized with a mixed solution of chloroform and hexane to give 1.4 g of a light yellow powdered solid, which was the object of the synthesis, in a yield of 40%. A synthesis scheme of Step 1 is shown in (b-1) given below.

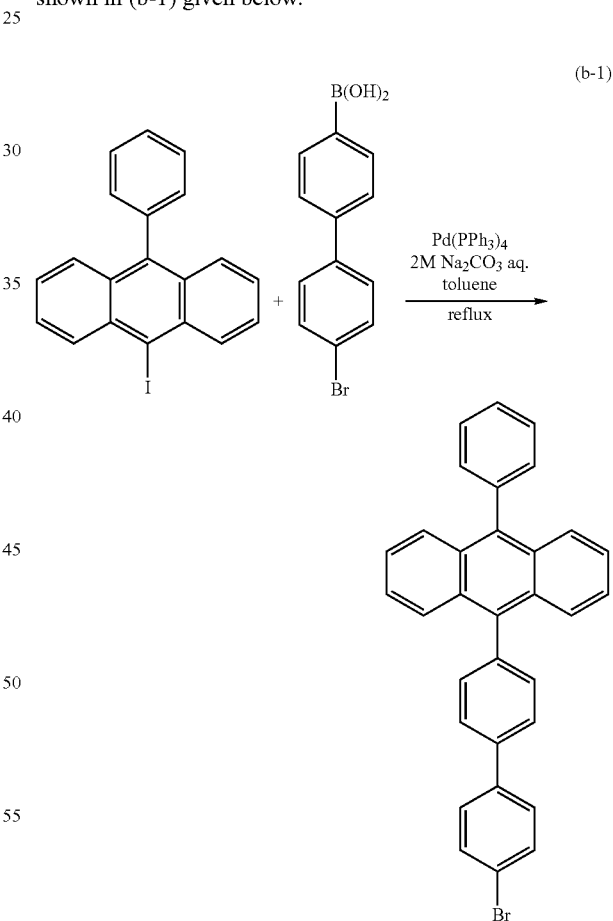

(b-1)

Step 2: Synthesis of 4-[4-(10-phenyl-9-anthryl)phenyl]-4'-(9-phenyl-9H-carbazol-3-yl)triphenylamine (PCBAPBA)

Into a 50 mL three-neck flask were put 1.0 g (2.1 mmol) of 9-(4'-bromobiphenyl-4-yl)-10-phenylanthracene, 845 mg (2.1 mmol) of 4-(9-phenyl-9H-carbazol-3-yl)diphenylamine (abbreviation: PCBA, which was synthesized in a similar manner to Step 1 and Step 2 in the synthesis method of the above PCBAPA), and 1.0 g (10 mmol) sodium tert-butoxide. The air in the flask was replaced with nitrogen. To the mixture were added 15 mL of toluene and 0.10 mL of tri(tert-butyl) phosphine (a 10 wt % hexane solution). Under reduced pressure, this mixture was degassed while being stirred. After the degassing, 58 mg (0.10 mmol) of bis(dibenzylideneacetone) palladium(0) was added to the mixture. This mixture was stirred at 100° C. for 5 hours. After the stirring, the temperature of the mixture was cooled down to room temperature, and then about 20 mL of toluene was added to the mixture. The mixture was subjected to filtration through Florisil (produced by Wako Pure Chemical Industries, Ltd., Catalog No. 540-00135), celite (produced by Wako Pure Chemical Industries, Ltd., Catalog No. 531-16855), and alumina. The obtained filtrate was condensed to give a light yellow solid. This obtained solid was recrystallized with a mixed solution of toluene and hexane to give 1.5 g of a light yellow powdered solid, which was the object of the synthesis, in a yield of 90%. A synthesis scheme of Step 2 is shown in (b-2) given below.

Then, 1.1 g of the obtained light yellow powdered solid was purified by train sublimation. As sublimation purification, PCBAPBA was heated at 380° C. under a pressure of 6.0 Pa with a flow rate of argon gas of 3.0 mL/min. After the sublimation purification, 1.0 g of a light yellow solid was obtained in a yield of 93%.

The obtained solid was analyzed by $^1$H NMR. The measurement result is described below. The measurement result shows that PCBAPBA was obtained.

$^1$H NMR (DMSO-$d_6$, 300 MHz): δ=7.09-7.12 (m, 1H), 7.25-7.31 (m, 12H), 7.34-7.79 (m, 23H), 7.80-7.85 (m, 4H), 8.20 (d, J=7.8 Hz, 1H), 8.36 (d, J=1.5 Hz, 1H)

This application is based on Japanese Patent Application serial No. 2008-068943 filed with Japan Patent Office on Mar. 18, 2008, the entire contents of which are hereby incorporated by reference.

REFERENCE NUMERALS

100: anode, 101: cathode, 102: light-emitting layer, 102a: first light-emitting layer, 102b: second light-emitting layer, 103: organic compound-containing layer, 104: hole-injecting

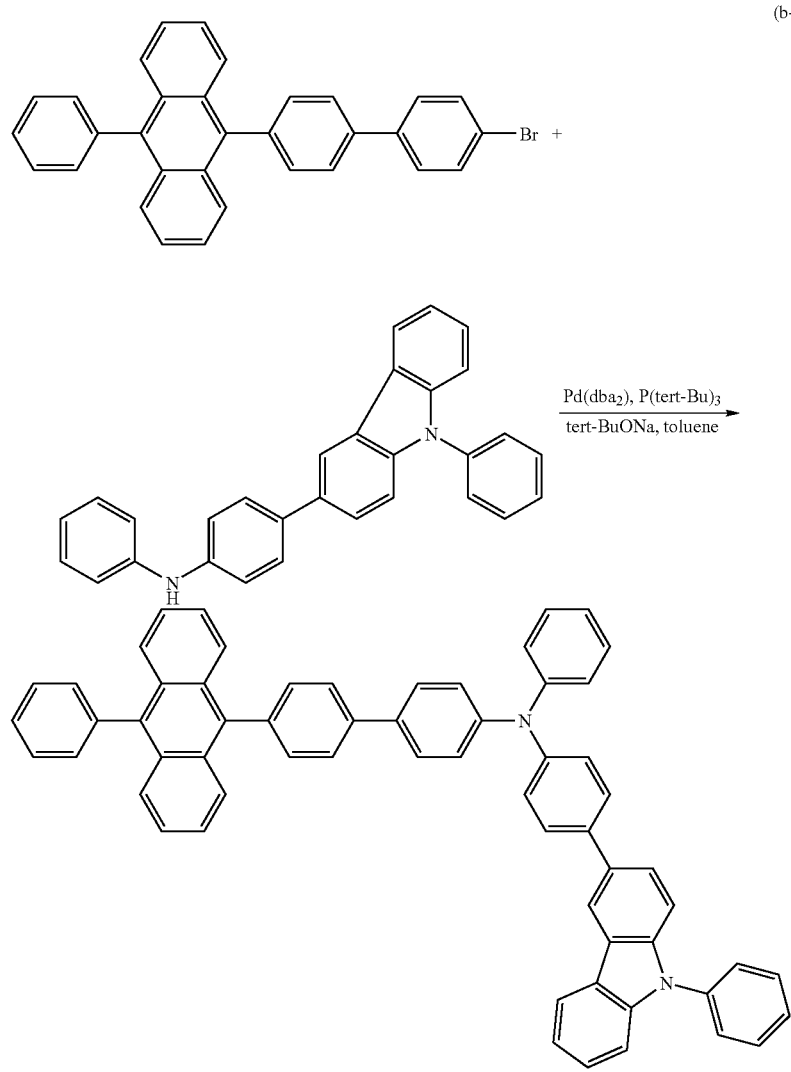

layer, 105: hole-transporting layer, 106: electron-transporting layer, 107: electron-injecting layer, 110: light-emitting element, 200: HOMO level of the hole-transporting layer, 201: HOMO level of the first light-emitting layer, 202: HOMO level of a first substance in the second light-emitting layer, 203: HOMO level of a second substance in the second light-emitting layer, 210: hole, 260: electron, 601: driver circuit portion (source side driver circuit), 602: pixel portion, 603: driver circuit portion (gate side driver circuit), 604: sealing substrate, 605: sealant, 607: space, 608: lead wiring, 609: FPC (flexible print circuit), 610: element substrate, 611: switching TFT, 612: current control TFT, 613: first electrode, 614: insulator, 616: layer containing an organic compound, 617: second electrode, 618: light-emitting element, 623: n-channel TFT, 624: p-channel TFT, 901: housing, 902: liquid crystal layer, 903: backlight unit, 904: housing, 905: driver IC, 906: terminal, 951: substrate, 952: electrode, 953: insulating layer, 954: partition layer, 955: layer containing an organic compound, 956: electrode, 2001: housing, 2002: light source, 3001: lighting device, 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing device, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation key, 9510: eye piece portion,

The invention claimed is:
1. A light-emitting element comprising:
an anode;
a hole-injection layer over and in contact with the anode;
a hole-transporting layer over the hole-injection layer;
a first light-emitting layer over and in direct contact with the hole-transporting layer, the first light-emitting layer substantially consisting of a first substance;
a second light-emitting layer over and in contact with the first light-emitting layer, the second light-emitting layer comprising a second substance in which the first substance is doped;
an electron transporting layer over the second light-emitting layer; and
a cathode formed over the electron transporting layer,
wherein the second substance has an energy gap larger than the first substance.
2. The light-emitting element according to claim 1,
wherein the first substance is an anthracene derivative having an aryl group at a 9 position and a 10 position of an anthracene unit of the anthracene derivative, and
wherein at least one of the aryl groups is bounded to an diarylamine group.
3. The light-emitting element according to claim 1,
wherein the first substance is an anthracene derivative having an aryl group at a 9 position and a 10 position of an anthracene unit of the anthracene derivative, and
wherein at least one of the aryl groups is bounded to an diarylamine group and is selected from a phenylene group, a biphenylene group, a fluorenylene group, and a spirofluorenylene group.
4. The light-emitting element according to claim 1,
wherein the second substance has a structure of a 9,10-diarylanthracene,
wherein the first substance is an anthracene derivative having an aryl group at a 9 position and a 10 position of an anthracene unit of the anthracene derivative, and
wherein at least one of the aryl groups is bounded to an diarylamine group.
5. The light-emitting element according to claim 1,
wherein the second substance has a structure of 9,10-diarylanthracene,
wherein the first substance is an anthracene derivative having an aryl group at a 9 position and a 10 position of an anthracene unit of the anthracene derivative, and
wherein at least one of the aryl groups is bounded to an diarylamine group and is selected from a phenylene group, a biphenylene group, a fluorenylene group, and a spirofluorenylene group.
6. The light-emitting element according to claim 1,
wherein the first substance is selected from following compounds:

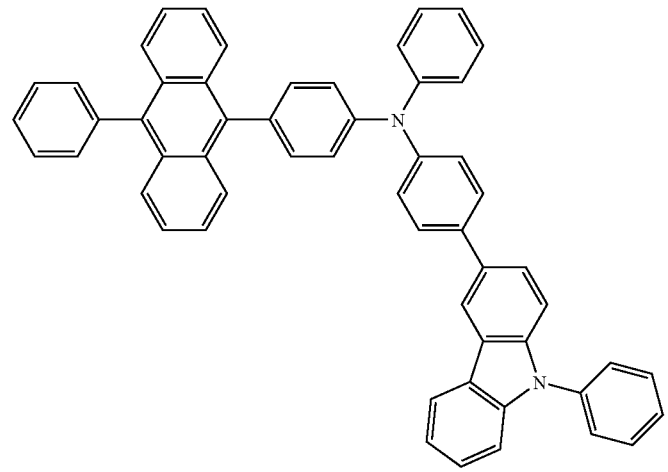

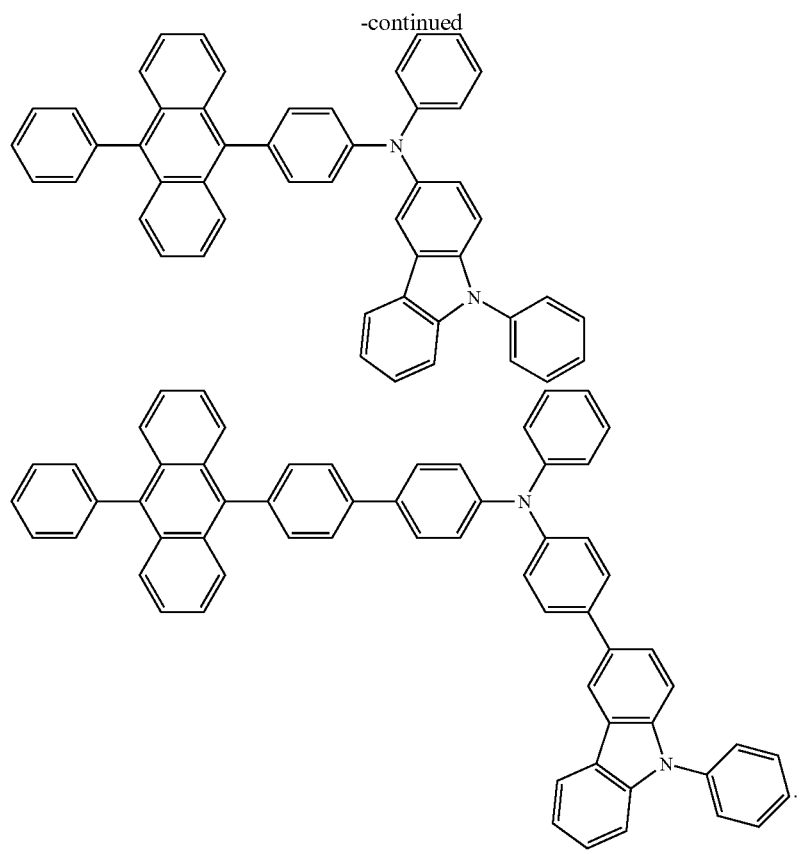

7. The light-emitting element according to claim 1, wherein a content of the first substance in the second light-emitting layer is from 0.001 wt % to 30 wt %, inclusive.

8. The light-emitting element according to claim 1, wherein a material which is included in the hole-transporting layer is different from the first substance.

9. The light-emitting element according to claim 1, wherein the hole-transporting layer is in contact with the hole-injection layer, and
wherein a material which is included in the hole-transporting layer is different from the first substance.

10. The light-emitting element according to claim 1, wherein the first substance is capable of emit blue light, allowing the light-emitting element to emit blue light.

11. A lighting device comprising the light-emitting element according to claim 1.

12. An electronic device including a display portion, the display portion comprising a light-emitting element which comprises:
an anode;
a hole-injection layer over and in contact with the anode;
a hole-transporting layer over the hole-injection layer;
a first light-emitting layer over and in direct contact with the hole-transporting layer, the first light-emitting layer substantially consisting of a first substance;
a second light-emitting layer over and in contact with the first light-emitting layer, the second light-emitting layer comprising a second substance in which the first substance is doped;
an electron transporting layer over the second light-emitting layer; and
a cathode over the electron transporting layer,
wherein the second substance has an energy gap larger than the first substance.

13. The electronic device according to claim 12, wherein the first substance is an anthracene derivative having an aryl group at a 9 position and a 10 position of an anthracene unit of the anthracene derivative, and
wherein at least one of the aryl groups is bounded to an diarylamine group.

14. The electronic device according to claim 12, wherein the first substance is an anthracene derivative having an aryl group at a 9 position and a 10 position of an anthracene unit of the anthracene derivative, and
wherein at least one of the aryl groups is bounded to an diarylamine group and is selected from a phenylene group, a biphenylene group, a fluorenylene group, and a spirofluorenylene group.

15. The electronic device according to claim 12, wherein the second substance has a structure of a 9,10-diarylanthracene,
wherein the first substance is an anthracene derivative having an aryl group at a 9 position and a 10 position of an anthracene unit of the anthracene derivative, and
wherein at least one of the aryl groups is bounded to an diarylamine group.

16. The electronic device according to claim 12, wherein the second substance has a structure of 9,10-diarylantluacene,
wherein the first substance is an anthracene derivative having an aryl group at a 9 position and a 10 position of an anthracene unit of the anthracene derivative, and
wherein at least one of the aryl groups is bounded to an diarylamine group and is selected from a phenylene group, a biphenylene group, a fluorenylene group, and a spirofluorenylene group.

17. The electronic device according to claim 12, wherein the first substance is selected from following compounds:

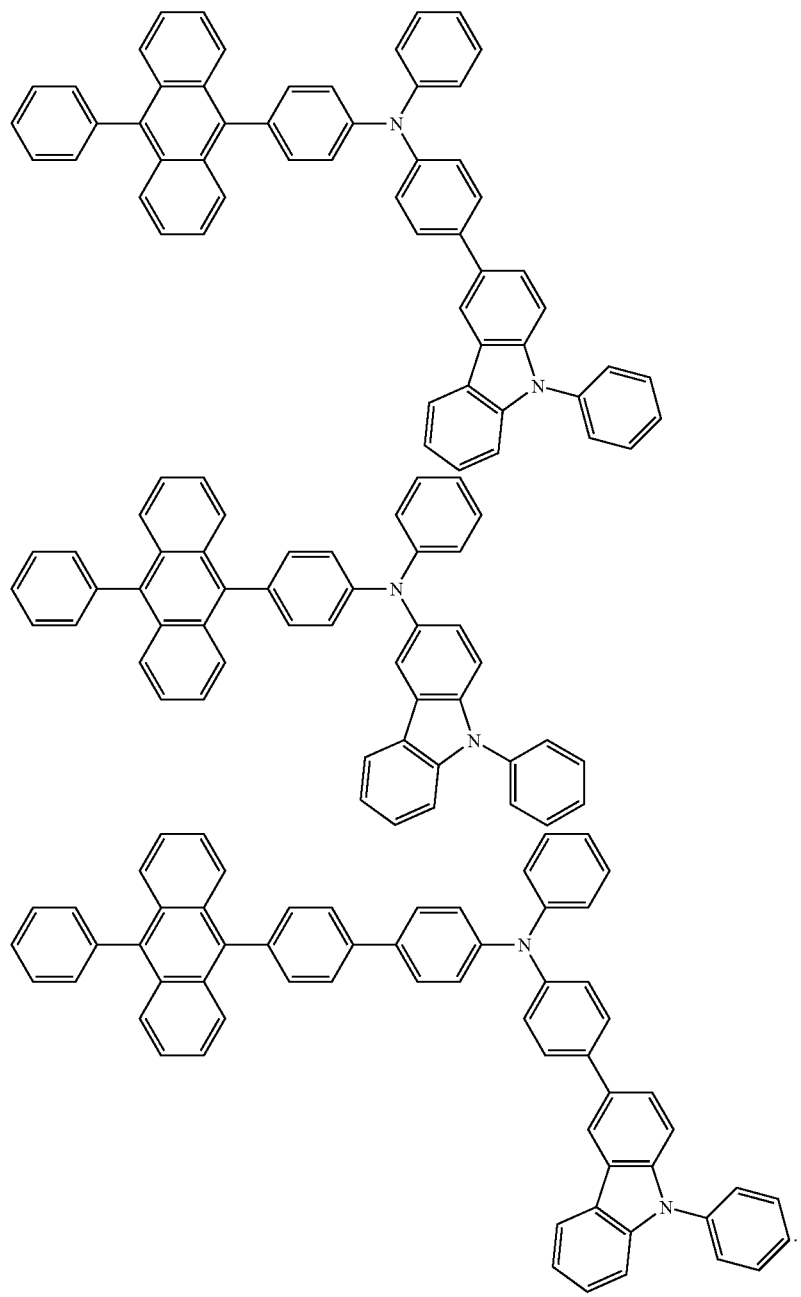

18. The electronic device according to claim 12, wherein a content of the first substance in the second light-emitting layer is from 0.001 wt % to 30 wt %, inclusive.

19. The electronic device according to claim 12, wherein the first substance is capable of emit blue light, allowing the light-emitting element to emit blue light.

* * * * *

UNITED STATES PATENT AND TRADEMARK OFFICE
CERTIFICATE OF CORRECTION

| | | |
|---|---|---|
| PATENT NO. | : 8,278,649 B2 | |
| APPLICATION NO. | : 12/404924 | |
| DATED | : October 2, 2012 | |
| INVENTOR(S) | : Nobuharu Ohsawa | |

It is certified that error appears in the above-identified patent and that said Letters Patent is hereby corrected as shown below:

In the Claims:

Column 40, Lines 59 and 60, Claim 16; Change "9,10-diarylantluacene" to -- 9,10-diarylanthracene --

Signed and Sealed this
Twenty-second Day of January, 2013

David J. Kappos
*Director of the United States Patent and Trademark Office*